(12) United States Patent
Maimon

(10) Patent No.: US 7,365,354 B2
(45) Date of Patent: *Apr. 29, 2008

(54) PROGRAMMABLE RESISTANCE MEMORY ELEMENT AND METHOD FOR MAKING SAME

(75) Inventor: Jon Maimon, Manassas, VA (US)

(73) Assignee: Ovonyx, Inc., Rochester Hills, MI (US)

( * ) Notice: Subject to any disclaimer, the term of this patent is extended or adjusted under 35 U.S.C. 154(b) by 42 days.

This patent is subject to a terminal disclaimer.

(21) Appl. No.: 10/308,399

(22) Filed: Dec. 2, 2002

(65) Prior Publication Data

US 2003/0122156 A1 Jul. 3, 2003

Related U.S. Application Data

(63) Continuation-in-part of application No. 10/072,369, filed on Feb. 8, 2002, now Pat. No. 6,774,387, and a continuation-in-part of application No. 09/955,408, filed on Sep. 19, 2001, now Pat. No. 6,613,604, and a continuation-in-part of application No. 09/891,157, filed on Jun. 26, 2001, now Pat. No. 6,750,079.

(51) Int. Cl.
*H01L 47/00* (2006.01)

(52) U.S. Cl. ............ 257/2; 257/3; 257/4; 257/E31.029; 365/33; 365/100

(58) Field of Classification Search ............... 257/2–5, 257/529, 530, 773–774, E31.029, E27.07; 365/33, 100, 145, 164
See application file for complete search history.

(56) References Cited

U.S. PATENT DOCUMENTS

| 5,933,365 | A  | * | 8/1999  | Klersy et al. ............... 365/148 |
| 6,031,287 | A  |   | 2/2000  | Harshfield |
| 6,605,527 | B2 | * | 8/2003  | Dennison et al. ........... 438/618 |
| 6,617,192 | B1 | * | 9/2003  | Lowrey et al. .............. 438/95 |
| 6,815,705 | B2 | * | 11/2004 | Klersy et al. ................. 257/3 |
| 6,943,365 | B2 | * | 9/2005  | Lowrey et al. ................ 257/3 |
| 6,972,428 | B2 | * | 12/2005 | Maimon ......................... 257/2 |
| 2002/0182835 | A1 | * | 12/2002 | Quinn ........................ 438/597 |

* cited by examiner

*Primary Examiner*—Thanhha S. Pham
(74) *Attorney, Agent, or Firm*—Kevin L. Bray

(57) ABSTRACT

A programmable resistance memory element using a conductive sidewall layer as the bottom electrode. The programmable resistance memory material deposited over the top edge of the bottom electrode, in a slot-like opening of a dielectric material. A method of making the opening.

34 Claims, 22 Drawing Sheets

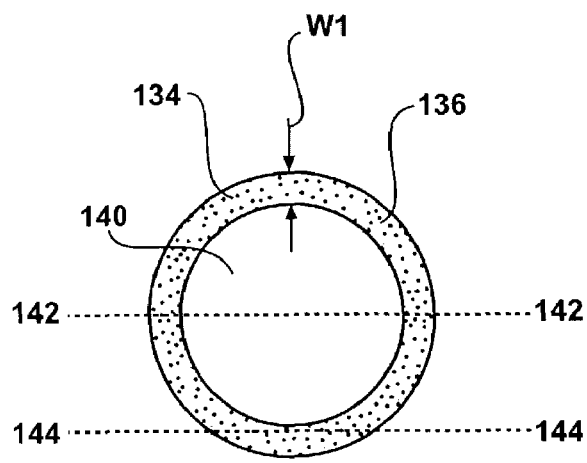
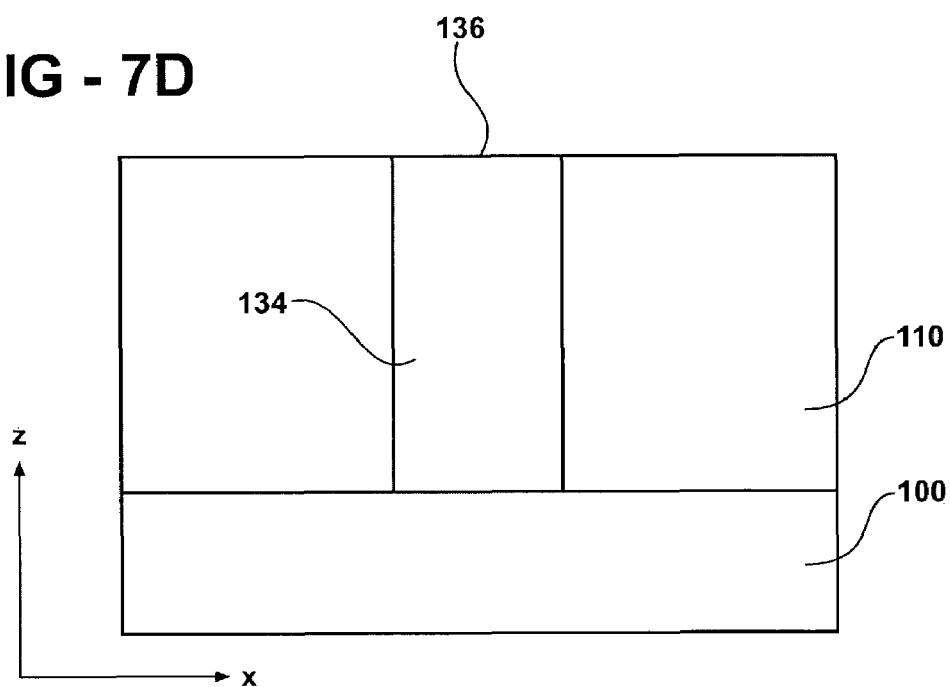
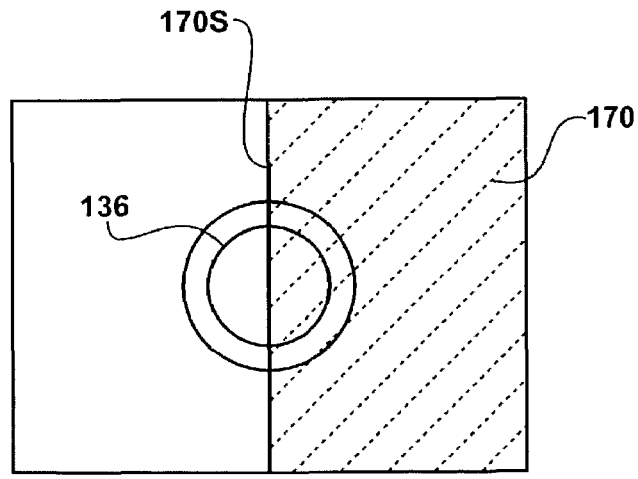

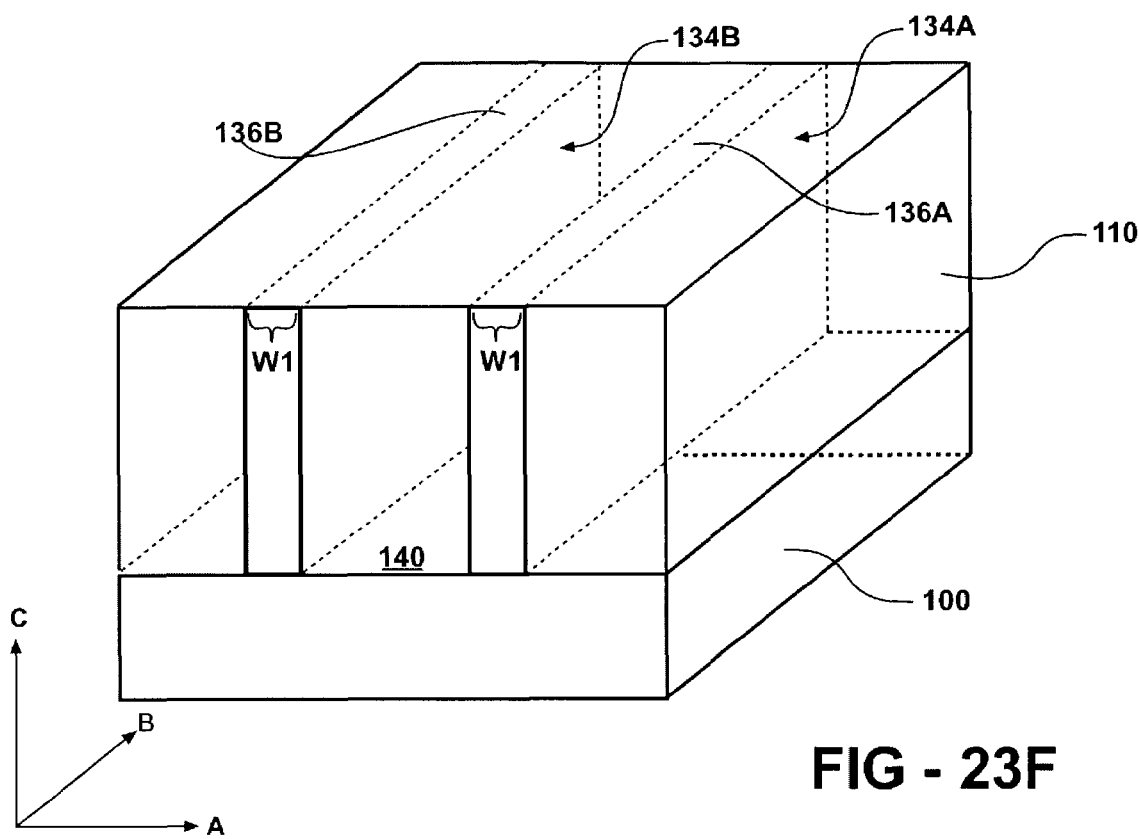
FIG - 23F
FIG - 23G
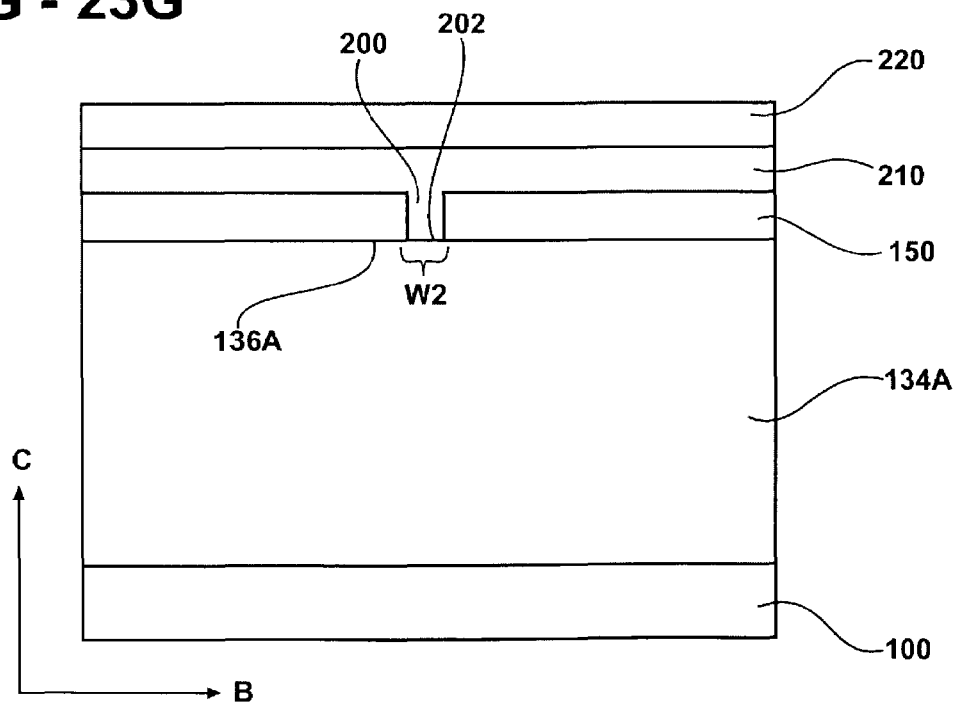

PROGRAMMABLE RESISTANCE MEMORY ELEMENT AND METHOD FOR MAKING SAME

RELATED APPLICATION INFORMATION

This application is a continuation-in-part of U.S. patent application Ser. No. 10/072,369 filed on Feb. 8, 2002 now U.S. Pat. No. 6,774,387. This application is also a continuation-in-part of U.S. patent application Ser. No. 09/955,408, filed on Sep. 19, 2001 now U.S. Pat. No. 6,613,604. This application is also a continuation-in-part of U.S. patent application Ser. No. 09/891,157, filed on Jun. 26, 2001 now Pat. No. 6,750,079. U.S. patent application Ser. Nos. 10/072,369, 09/955,408 and 09/891,157 are all hereby incorporated by reference herein.

PARTIES TO A JOINT RESEARCH AGREEMENT

The claimed invention was made by, on behalf at and/or in connection with one or both of the following parties to a joint research agreement in accordance with 35 U.S.C. 103(c)(3): Ovonyx, Inc. and Intel Corporation. The joint research agreement was in effect on and before the date the claimed invention was made and the claimed invention was made as a result of activities undertaken within the scope of the joint research agreement.

FIELD OF THE INVENTION

The present invention relates generally to programmable resistance memory elements. More specifically, the present invention relates to a new structural relationship between the electrodes and the memory material which are integral parts of the memory element.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ZERO data bit. As well, they may be programmed to a low resistance state to store, for example, a logic ONE data bit.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 Patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359,205, and 5,534,712, the disclosures of which are all hereby incorporated by reference herein.

The programming energy requirement may also be reduced through the appropriate modification of the electrical contacts used to deliver the programming energy to the memory material. For example, reduction in programming energy may be achieved by modifying the composition and/or shape and/or configuration (positioning relative to the memory material) of the electrical contacts. Examples of such "contact modification" are provided in U.S. Pat. Nos. 5,341,328, 5,406,509, 5,534,711, 5,536,947, 5,687,112, 5,933,365, the disclosures of which are all hereby incorporated by reference herein. Examples are also provided in U.S. patent application Ser. Nos. 09/276,273, 09/620,318, 09/677,957 and 09/891,157, the disclosures of which are all hereby incorporated by reference herein. The present invention is directed to novel structures of programmable resistance memory devices that may further reduce the programming energy requirements of such devices. The present invention is also directed to methods for making these structures.

SUMMARY OF THE INVENTION

One aspect of the present invention is a programmable resistance memory element, comprising: a first dielectric material having a sidewall surface; a conductive layer formed over the sidewall surface; a second dielectric material formed over the conductive layer, wherein an edge of the conductive layer is exposed; a third dielectric material formed over the edge, the third dielectric material having a opening formed therethrough uncovering a portion of the edge; and a programmable resistance material disposed in the opening and in communication with the edge.

Another aspect of the present invention is a programmable resistance memory element, comprising: a first layer of a conductive material; a second layer of a programmable resistance material, wherein an edge of the first layer is adjacent to an edge of the second layer.

Another aspect of the present invention is a programmable resistance memory element, comprising: a layer of a conductive material; a trench or pore of programmable resistance memory material adjacent to an edge of the layer of conductive material.

Another aspect of the present invention a method of forming an opening in a layer of a first material of a semiconductor device: providing the layer of the first material; forming a layer of a second material over the layer of the first material; forming a layer of a third material over the layer of the material; forming a sidewall surface in the layer of the third material; forming a sidewall spacer of a forth material on the sidewall surface; forming a layer of a fifth material over the sidewall spacer and an exposed portion of the layer of the second material; removing a portion of the fifth material to expose the sidewall spacer; removing the sidewall spacer; removing a portion of the layer of the second material exposing the layer of the first material; and removing a portion of the layer of the first material to form the opening.

Another aspect of the present invention is a method of forming an opening in a layer of a first material of a semiconductor device: providing the layer of the first material; forming a layer of a second material over the layer of the material; forming a sidewall surface in the layer of the second material; forming a sidewall spacer of a third material on the sidewall surface; forming a layer of a forth material over the sidewall spacer and an exposed portion of the layer of the first material; removing a portion of the forth material to expose the sidewall spacer; removing the sidewall spacer; and removing a portion of the layer of the first material to form the opening.

Another aspect of the present invention is a method of forming a programmable resistance memory element, comprising the steps of: providing a layer of a conductive material; forming a layer of a first material over the layer of the conductive material; forming a layer of a second material over the layer of the first material; forming a layer of a third material over the layer of the material; forming a sidewall surface in the layer of the third material; forming a sidewall spacer of a forth material on the sidewall surface; forming a layer of a fifth material over the sidewall spacer and an exposed portion of the layer of the second material; removing a portion of the fifth material to expose the sidewall spacer; removing the sidewall spacer; removing a portion of the layer of the second material exposing the layer of the first material; removing a portion of the layer of the first material to form the opening; and depositing a programmable resistance material into the opening, the programmable resistance material in communication with the layer of the conductive material.

Another aspect of the present invention is a method of forming a programming resistance memory element, comprising the steps of: providing a layer of a conductive material; forming a layer of a first material over the layer of the conductive material; forming a layer of a second material over the layer of the material; forming a sidewall surface in the layer of the second material; forming a sidewall spacer of a third material on the sidewall surface; forming a layer of a forth material over the sidewall spacer and an exposed portion of the layer of the first material; removing a portion of the forth material to expose the sidewall spacer; removing the sidewall spacer; removing a portion of the layer of the first material to form the opening; and depositing a programmable resistance material into the opening, the programmable resistance material in communication the layer of the conductive material.

It is noted that the two or more of the first, second, third, forth, and fifth materials may be the same material (or each may be a different material).

BRIEF DESCRIPTION OF THE DRAWINGS

FIG. 23F shows a three dimensional view of the conductive sidewall spacers of FIG. 23E;

FIG. 23G shows a cross-sectional view of an embodiment of a memory element of the present invention;

DETAILED DESCRIPTION OF THE INVENTION

In the following paragraphs and in association with the accompanying figures, examples of memory devices formed according to embodiments of the invention are presented. Specific embodiments of memory elements and methods of making such memory elements are described below as they might be implemented for use in semiconductor memory circuits. In the interest of clarity, not all features of an actual implementation are described in this specification.

The present invention is directed to programmable resistance memory elements. The memory element comprises a volume of memory material which is programmable between a first resistance state and a second resistance state in response to an electrical signal. The memory element further comprises a means of delivering the electrical signal to the volume of memory material. Preferably, the means of delivering the electrical signal comprises a first and a second electrical contact, also referred to as first and second electrodes, which are in electrical communication with the volume of memory material. The electrical contacts or electrodes do not have to be in physical contact with the memory material. (It is noted, that as used herein, the terminology "electrical contacts" and "electrodes" are synonymous and may be used interchangeably).

Figure 1:
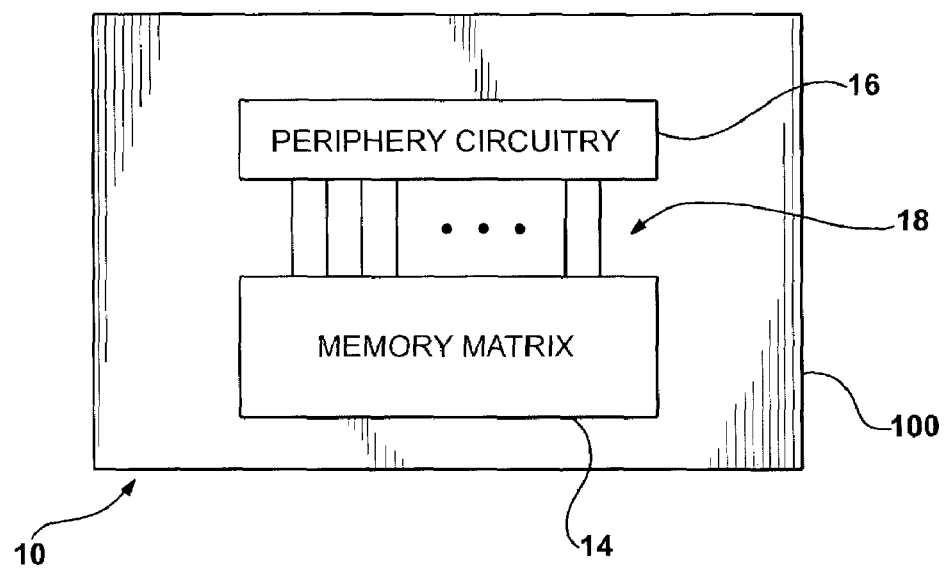
FIG. 1 shows a high-level diagram of an embodiment of a memory device of the present invention including a memory array and periphery circuitry formed on a substrate.

Turning now to the drawings, and referring initially to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2A:
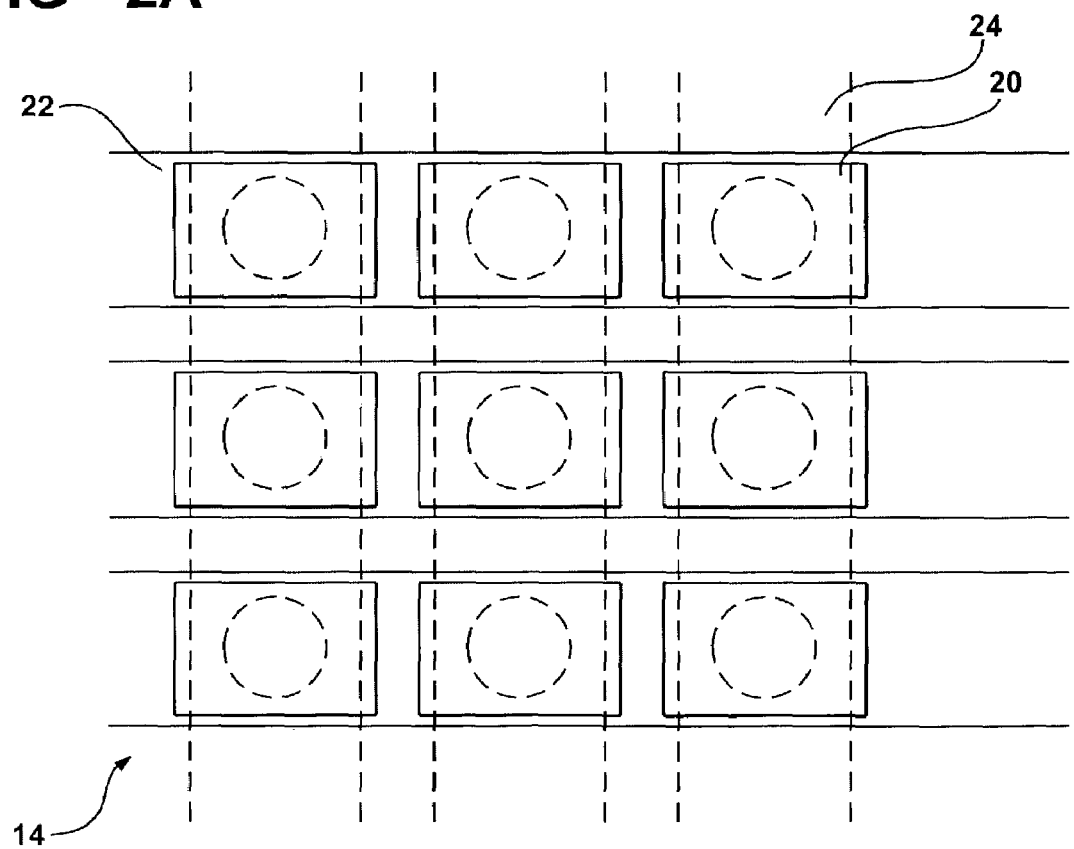
FIG. 2A shows a high-level diagram of an embodiment of a memory array of the present invention.

A top view of the memory array 14 is shown in FIG. 2A. As can be seen, the memory array includes a plurality of memory cells 20 that are arranged in generally perpendicular rows and columns. As can be seen, the memory array 14 includes a plurality of memory cells 20 that are arranged in generally perpendicular rows and columns. The memory cells 20 in each row are coupled together by a respective wordline 22, and the memory cells 20 in each column are coupled together by a respective bitline 24.

Figure 2B:
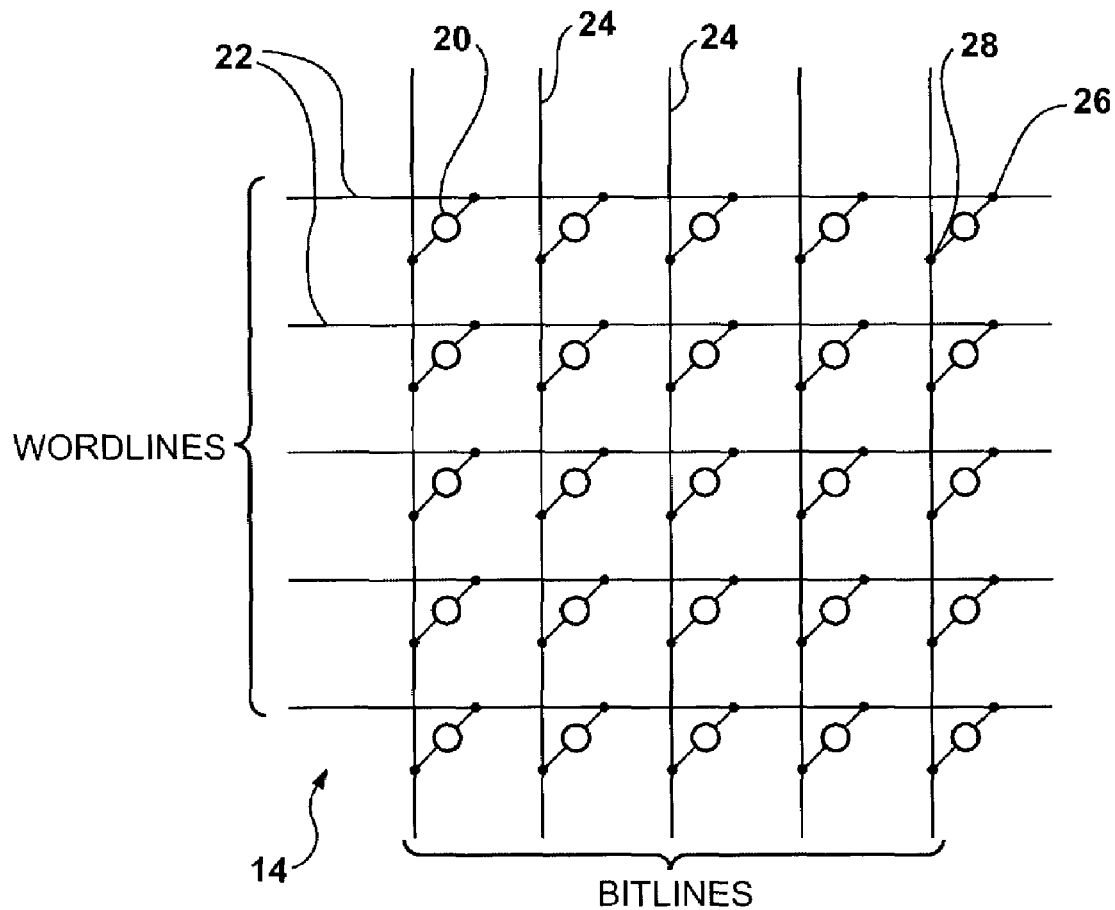
FIG. 2B is a schematic diagram of an embodiment of a memory array of the present invention.

A schematic diagram of the memory array 14 is shown in FIG. 2B. As can be seen, each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 3:
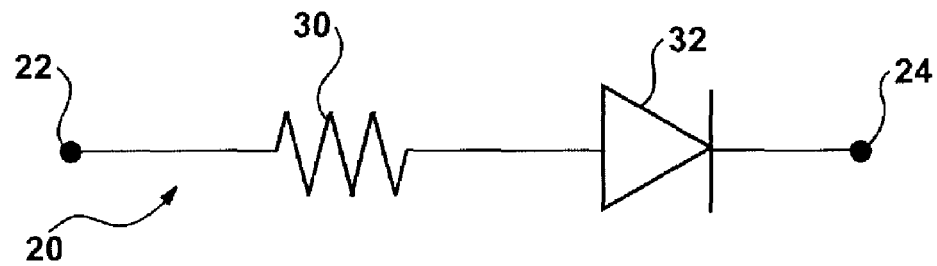
FIG. 3 is a schematic diagram of an embodiment of a memory cell of the present invention incorporating a programmable resistance material.

FIG. 3 illustrates an exemplary memory cell 20 that may be used in the memory array 14. The memory cell 20 includes a memory element 30 which is coupled to an access device 32. The access device electrically isolates each memory element from all other memory elements in the array. In this embodiment, the memory element 30 is illustrated as a programmable resistive element, and the access device 32 is illustrated as a diode. The programmable resistive element may be made of a chalcogenide material, as will be more fully explained below. As illustrated in FIG. 3, the memory element 30 is coupled to a wordline 22, and the access device 32 is coupled to a bitline 24. However, it should be understood that connections of the memory element 20 may be reversed without adversely affecting the operation of the memory array 14.

Figure 18:
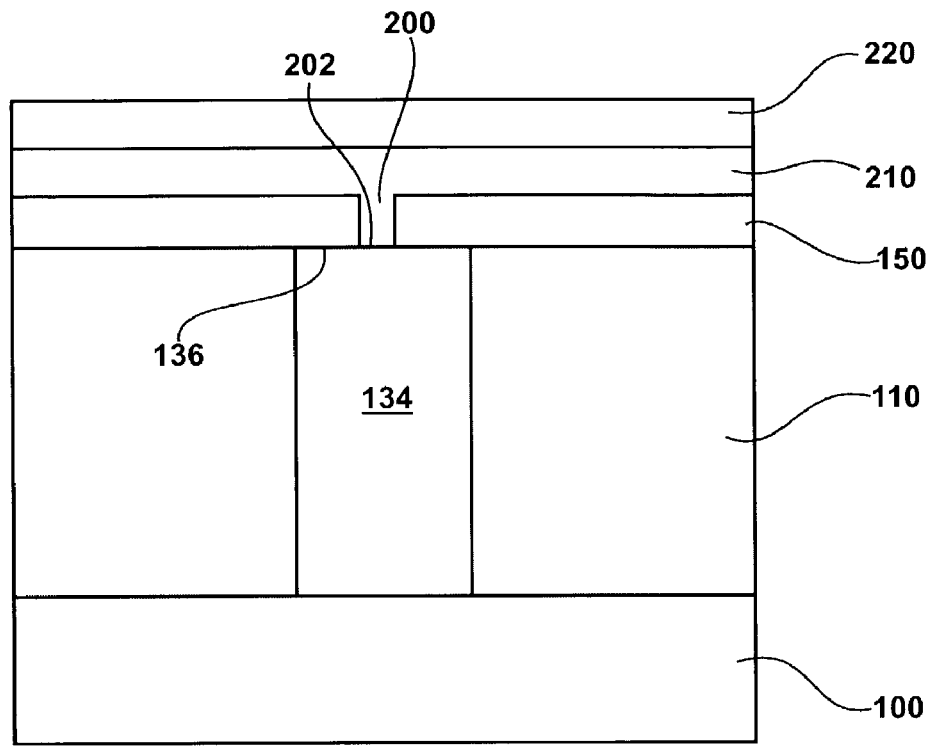
Figure 19:
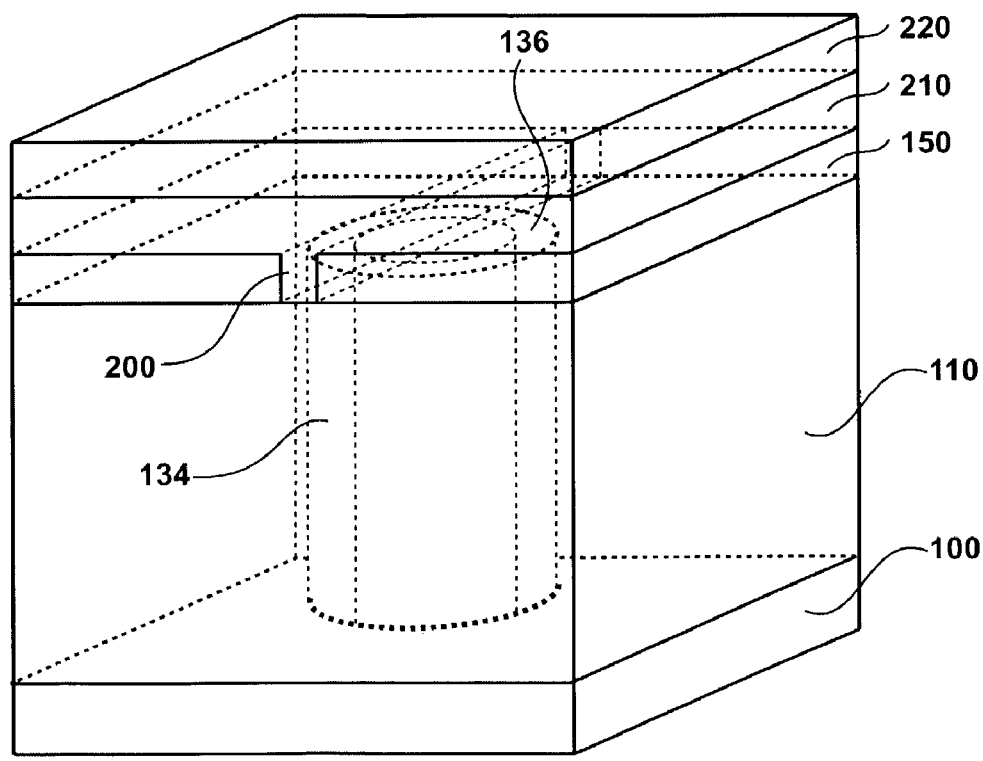
FIG. 19 shows an embodiment of a memory cell of the present invention.

A structure of an exemplary memory cell 20 is illustrated in FIG. 19, while a method for fabricating the memory cell 20 is described with reference to FIGS. 4A-18. It should be understood that while the fabrication of only a single memory cell 20 is discussed below, a plurality of similar memory cells may be fabricated simultaneously. Although not illustrated, each memory cell is electrically isolated from other memory cells in the array in any suitable manner, such as by the addition of imbedded field oxide regions between each memory cell.

Figure 4A:
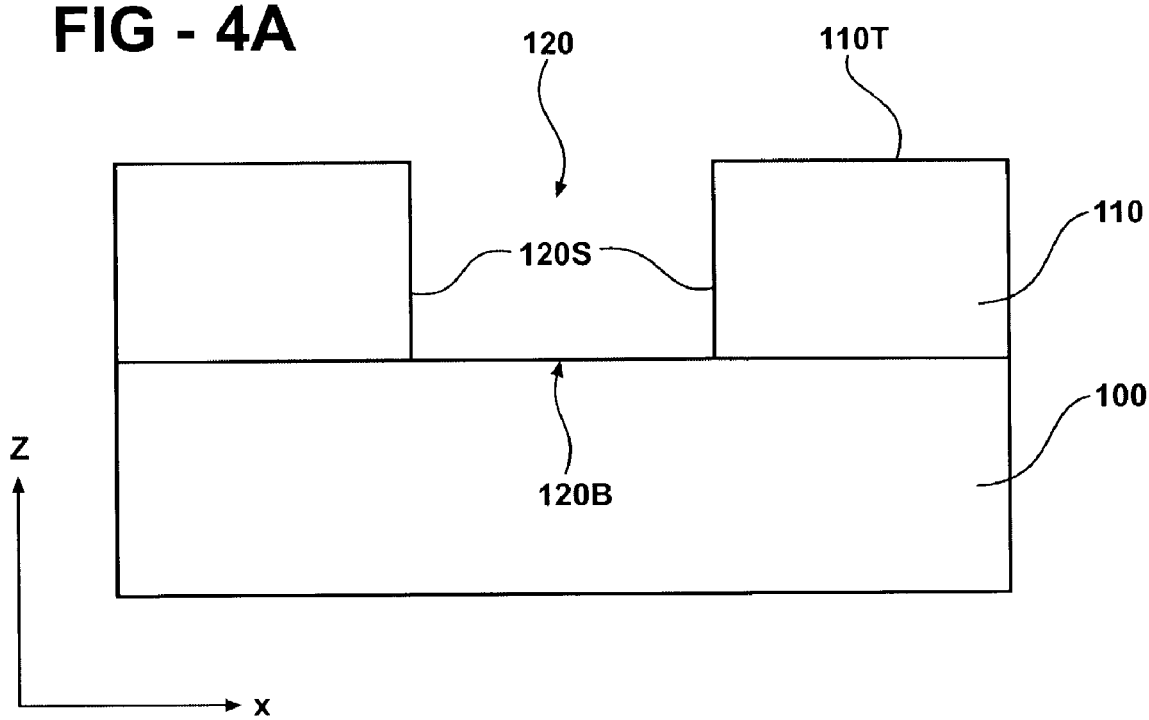
FIGS. 4A through 18 shows a process for making an embodiment of a memory cell of the present invention.

Referring first to FIG. 4A, a semiconductor substrate 100 is provided. The substrate 100 may include the access devices as well as the bitlines and/or wordlines. A layer of dielectric material 110 is formed, on top of the substrate 100. The layer 110 may be comprised of any suitable dielectric material, such as silicon nitride or silicon dioxide. The dielectric layer 110 may be formed in any suitable manner, such as by chemical vapor deposition (CVD). The dielectric layer 110 has a top surface 110T.

Referring to FIG. 4A, an opening 120 (also referred as a "window") is formed through the dielectric layer 110 to expose a portion of the underlying substrate. Generally, the opening 120 may be any shape. For example, the opening 120 may be formed as a hole (such as a substantially circular or rectangular hole) Alternately, the opening 120 may be formed as a trench. The opening 120 includes the sidewall surface 120S about the periphery of the opening and the bottom surface 120B. The sidewall surface 120S of the opening corresponds to a sidewall surface of the dielectric material 110. The opening 120 is preferably a substantially circular hole as shown in FIG. 4B.

Any suitable method of forming the opening 120 may be used. For example, using standard photolithographic techniques, a hard mask (not shown) may be deposited on top of the dielectric layer 110 and patterned in the size and shape of the resulting opening 120. Hence, the opening 120 may be sized at the photolithographic limit.

Figure 4B:
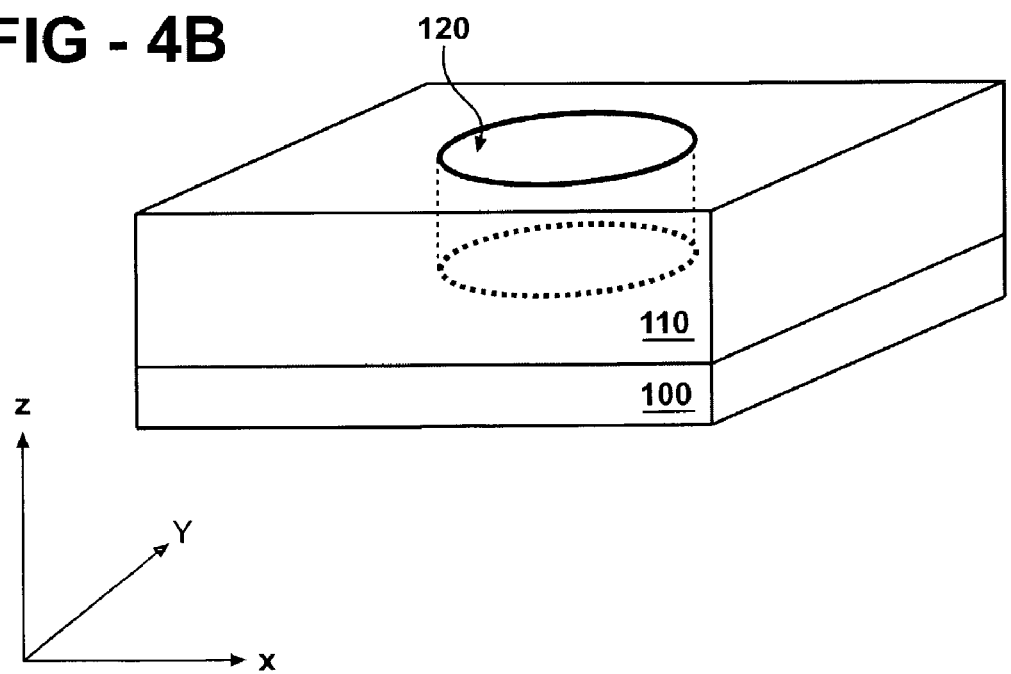
Figure 5:
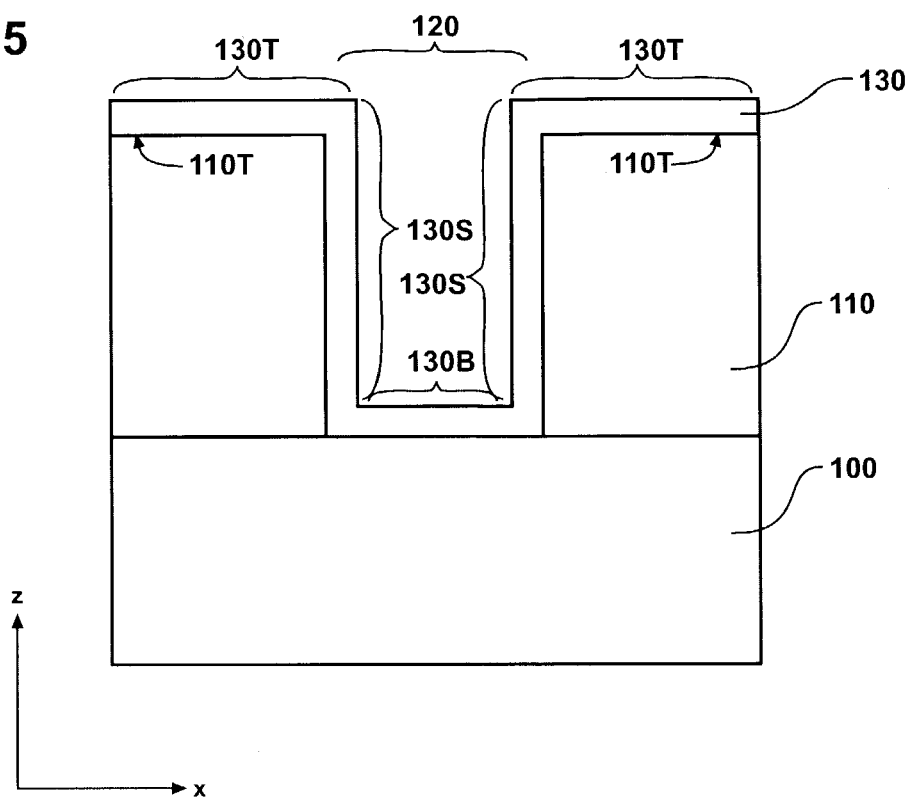

As shown in FIG. 5, a layer 130 of a conductive material is deposited on top of the structure shown in FIGS. 4A and 4B. The layer 130 of conductive material is deposited on top surfaces 110T of the dielectric region 110 as well as on the sidewall surface 120S and on the bottom surface 120B of opening 120. Preferably, the deposition of the layer 130 is a substantially conformal deposition. Hence, the layer 130 has a top portion 130T, a sidewall layer portion 130S, and a bottom layer portion 130B.

The conductive material used for layer 130 may be any conductive material. Examples of materials which may be used for layer 130 are include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, and titanium nitride. Other examples include titanium carbon-nitride, titanium aluminum-nitride, titanium silicon-nitride, and carbon.

Figure 6:
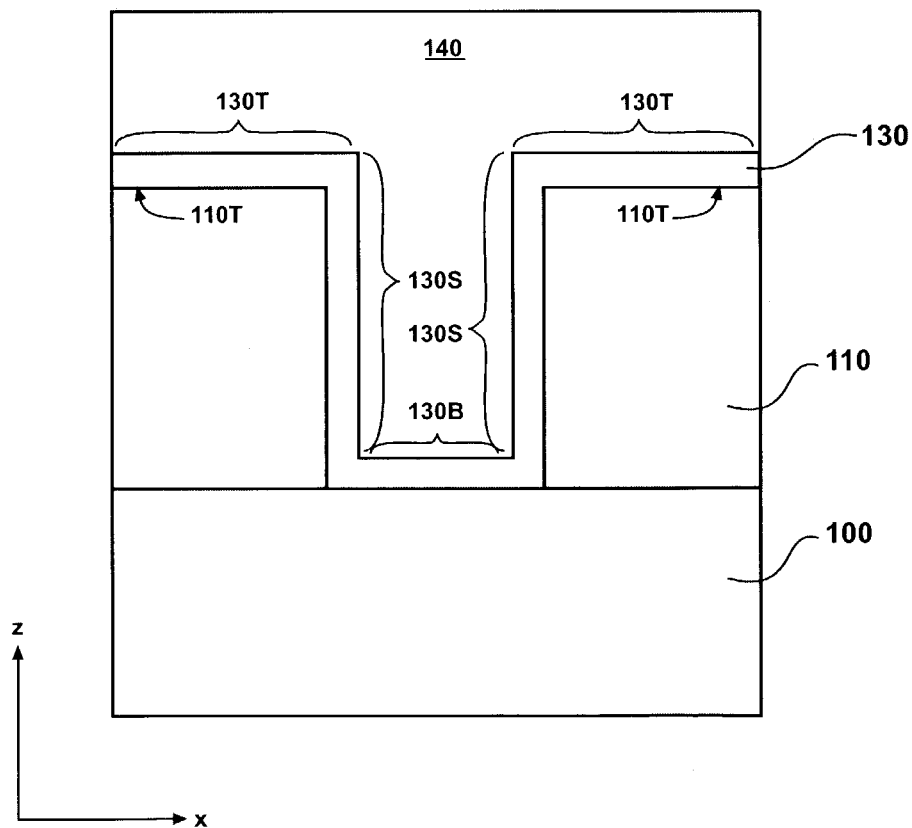
Figure 7A:
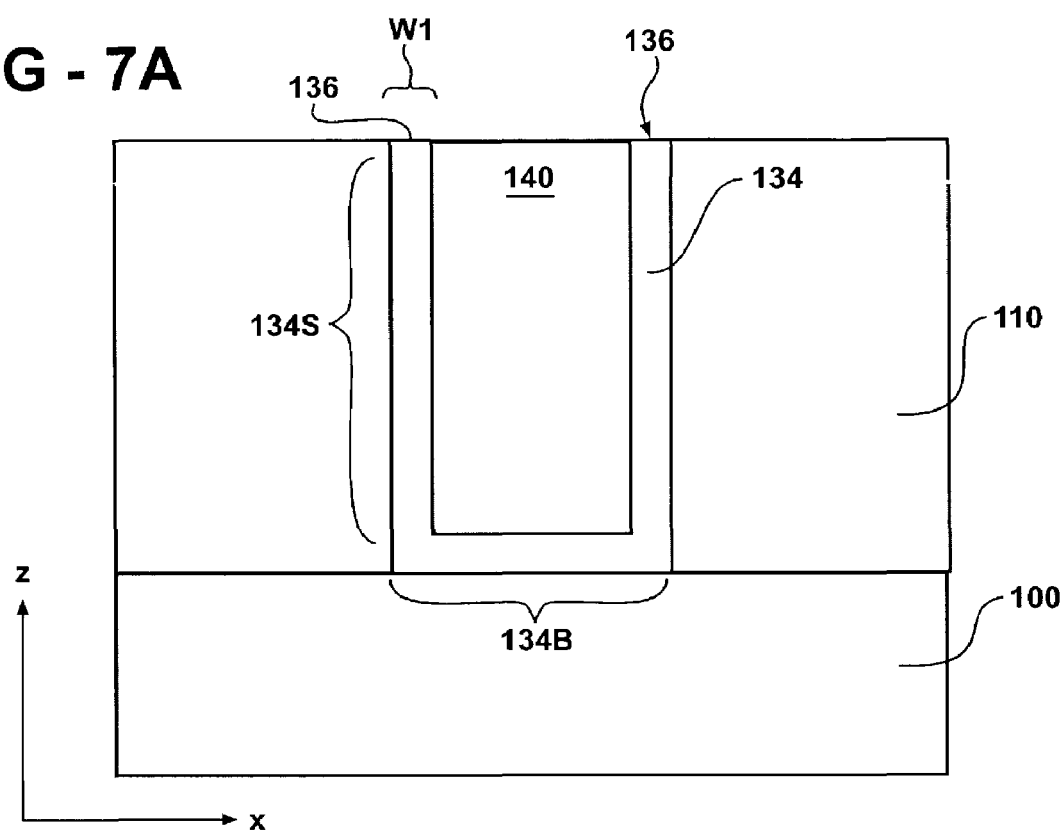

Referring to FIG. 6, a layer of dielectric material 140 (such as silicon dioxide) may then be deposited on top of the layer 130. Preferably, the dielectric layer 140 fills the remaining portion of opening 120 and is deposited above the top surfaces 110T. The structure shown in FIG. 6 may then be chemically mechanically polished (CMP) or dry etched so as to planarize the top surface, thereby removing the top surface portion 130T of the layer 130 and forming the bottom electrode 134 as shown in FIG. 7A (cross-sectional view parallel to the x-z plane) and in FIG. 7B (three-dimensional view). The bottom electrode 134 is in the form of a cylindrical, cup-shaped conductive liner 134. The bottom electrode 134 has a top surface or edge portion 136 which is in the shape of an annulus. The bottom electrode 134 has a sidewall layer portion 134S and a bottom layer portion 134B. The bottom electrode 134 has a thickness "W1" which is defined by the thickness of the conformal deposition of conductive layer 130 shown in FIG. 5. The thickness W1 is preferably smaller than that which could be achieved by standard photolithography. That is, the thickness W1 is preferably less than the photolithographic limit. The photolithographic limit is currently greater than 1000 Angstroms. In one embodiment of the presentg invention, the thickness W1 is preferably less than about 1000 Angstroms, more preferably less than about 500 Angstroms and, most preferably, less than about 300 Angstroms.

Figure 7B:
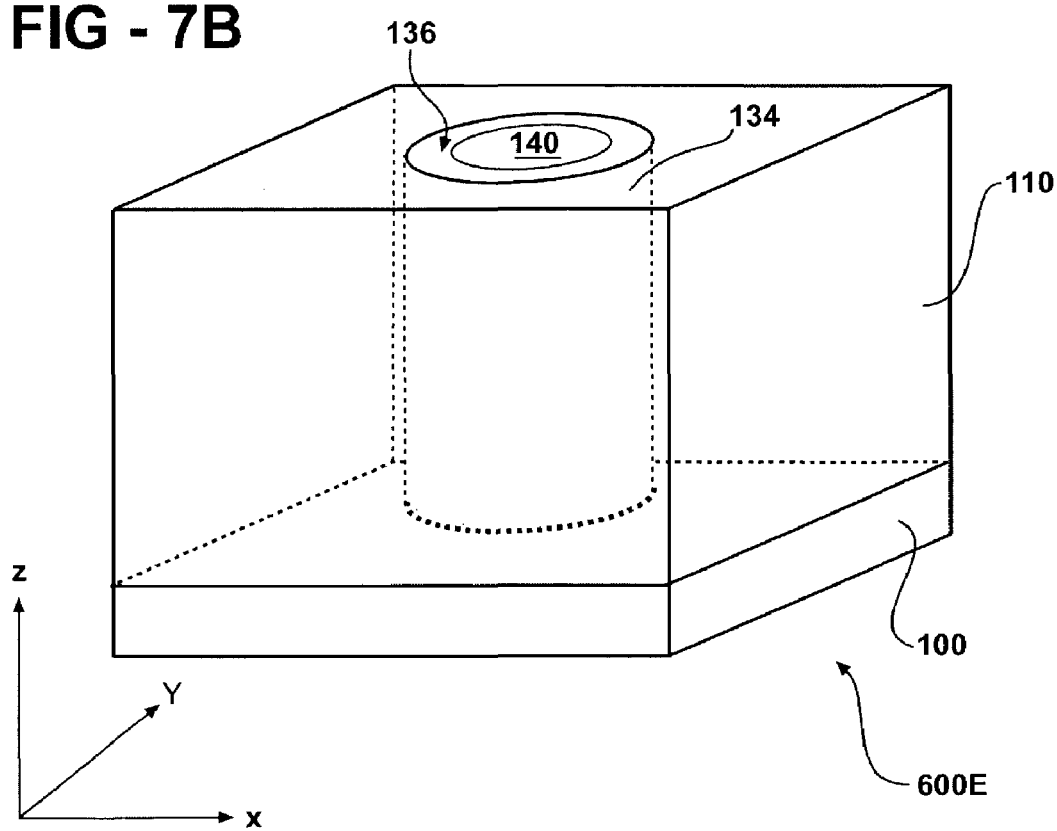

In the example shown in FIGS. 7A and 7B, the bottom electrode 134 is cylindrically shaped and the exposed top surface or edge 136 forms an annularly shaped contact surface. As discussed above, the opening 120 (shown in FIGS. 4A and 4B) may also be formed as a trench. In this case, the resulting bottom electrode would be a conductive sidewall liner that is U-shaped, having a bottom surface and two sidewall surfaces. The resulting exposed top surface or edge portion of the U-shaped conductive liner would be two linear contact surfaces. In an alternate embodiment of the invention (explained in more detail below), the bottom electrode may be formed as a conductive spacer rather than as a conductive liner. A conductive spacer is explained in more detail below.

FIG. 7C shows a top view of the bottom electrode 134 showing the top edge 136 and dielectric 140. As shown in FIG. 7C, the top surface or edge 136 of the bottom electrode 134 preferably has a width W1 that corresponds to the thickness of the conductive layer 134. The width W1 may be less than the photolithographic limit which is currently greater than 1000 Angstroms. The width W1 of the top edge 136 is preferably less than about 1000 Angstroms, more preferably less than about 500 Angstroms and most preferably less than about 300 Angstroms.

FIG. 7A is the cross-sectional view through taken from line 142-142 of FIG. 7C. FIG. 7D is the cross-sectional view taken from line 144-144 of FIG. 7C.

Figure 8:
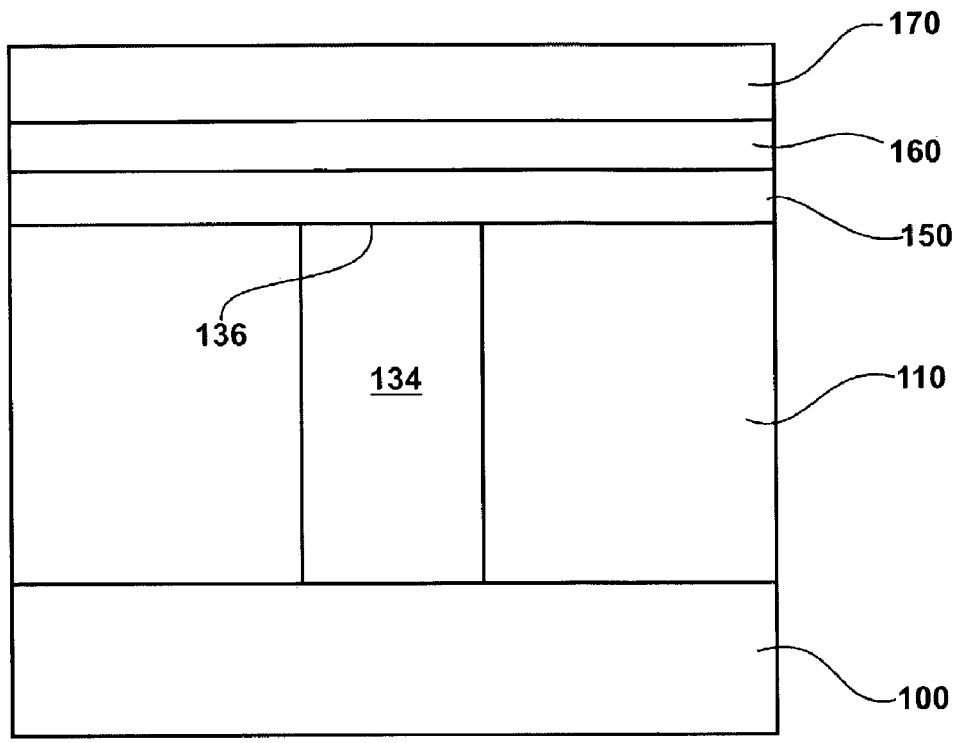

Referring to FIG. 8, a layer 150 is deposited over the top surface of the structure shown in FIG. 7D (again, this is the cross-sectional view taken from line 144-144 of FIG. 7C). Preferably, the layer 150 is formed of a dielectric material. Any dielectric material may be used (such as an oxide or a nitride). More preferably, the layer 150 is formed from an oxide. Most preferably, the layer 150 is formed from silicon dioxide from a TEOS source. The layer 150 may be deposited by any suitable manner such as by chemical vapor deposition or by physical vapor deposition.

A layer 160 is then deposited over the oxide layer 150. Preferably, the layer 160 is formed from a nitride (such as a silicon nitride). However, in another embodiment of the invention is possible to form the layer 160 from any other dielectric (such as an oxide). In yet other embodiments of the invention, it is possible that layer 160 be formed from a semi-conductor (such a polysilicon) or a conductor (such as a metal).

A layer 170 is then deposited over the nitride layer 160 to form the structure shown in FIG. 8. The layer 170 is preferably formed from an oxide (such as silicon dioxide from a TEOS source). However, in another embodiment of the invention is possible for form layer 170 from any other dielectric (such as a nitride). In yet other embodiments of the invention, it is possible that layer 170 be formed from a semi-conductor (such a polysilicon) or a conductor (such as a metal).

Figure 9A:
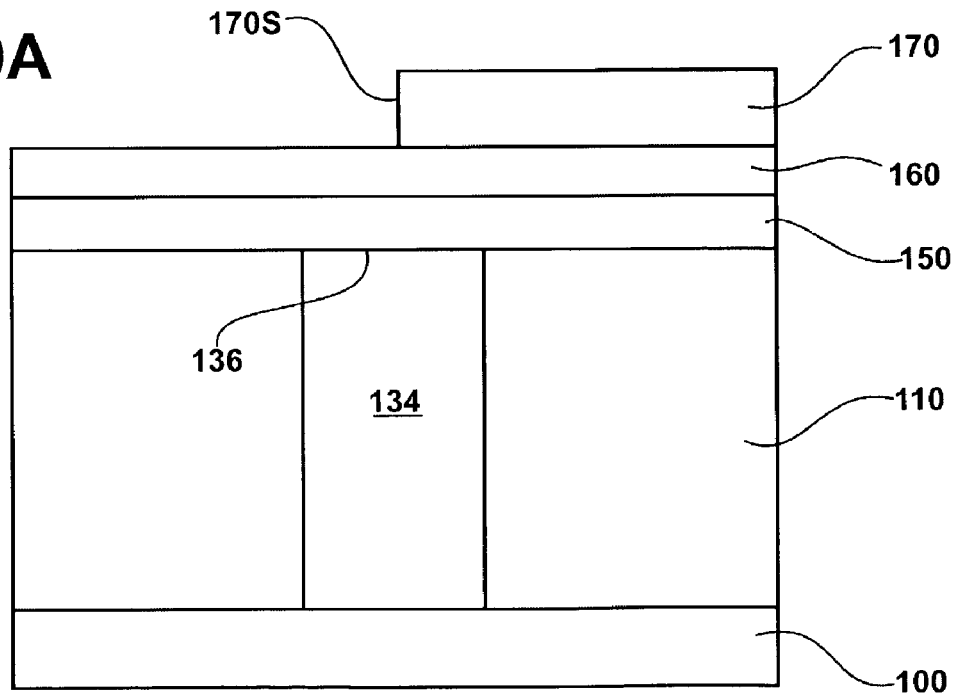

The oxide layer 170 is then patterned selective to the nitride layer 160 to form the sidewall surface 170S as shown in FIG. 9A. The position of the sidewall surface 170S relative to the top surface or edge portion 136 of the conductive liner 134 is shown in FIG. 9B which is a top view of the structure from FIG. 9A.

Figure 10:
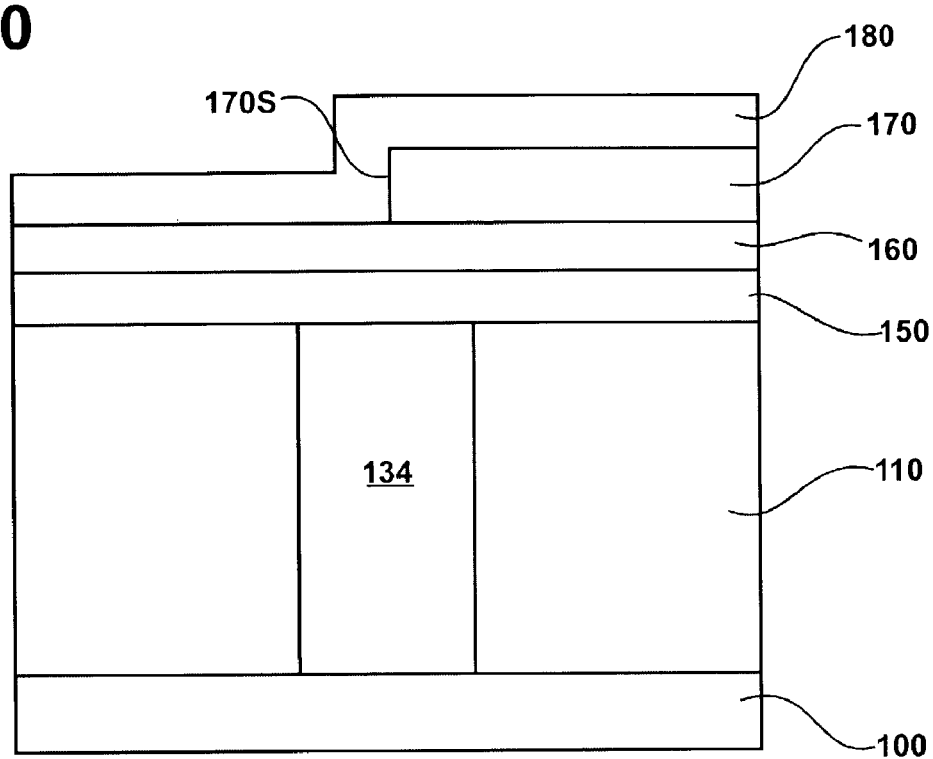

Referring to FIG. 10, a layer 180 then deposited over the structure shown in FIG. 9A. Preferably, the layer 180 is formed from a polysilicon. As shown, the polysilicon 180 is deposited over the top surface and sidewall surface 170S of the second oxide layer 170. The layer 180 is also deposited over an exposed portion of the nitride layer 160. Preferably, the deposition of the polysilicon layer 180 is a substantially conformal deposition. In other embodiments of the invention, it is possible that the layer 180 be formed of another type of material. For example, layer 180 may be formed of a dielectric material (such as an oxide or nitride). In yet other embodiments of the invention, it is even possible that the layer 180 be formed of a conductor (such as a metal).

Figure 11:
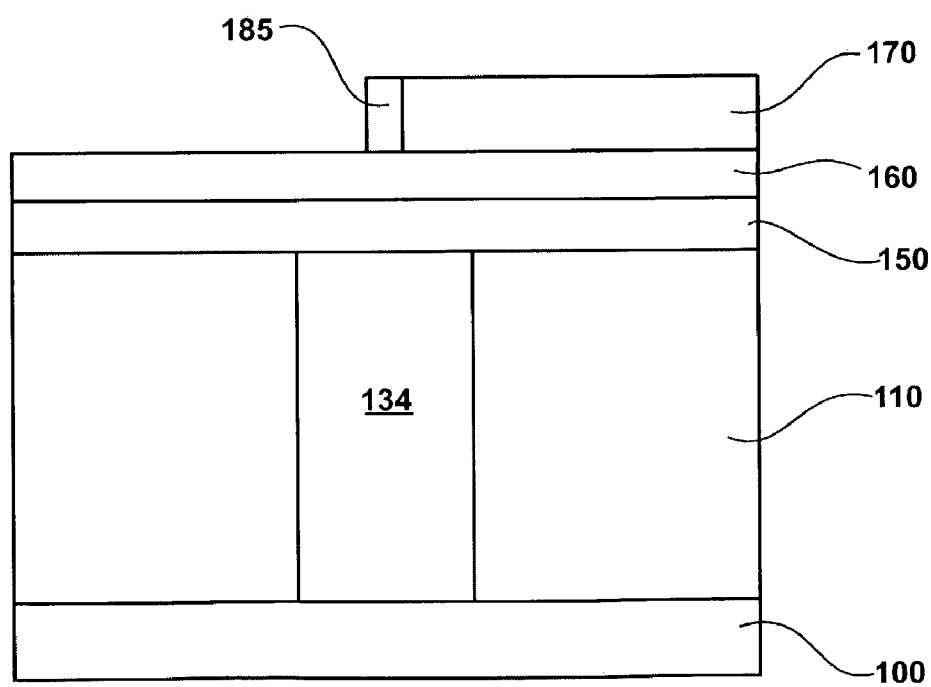

Referring to FIG. 11, the horizontally disposed portions of the polysilicon layer 180 are then removed preferably by an anisotropic etch of the polysilicon layer (the etch used is preferably selective to the TEOS oxide 170 and the nitride 160). The anisotropic etch leaves the polysilicon sidewall spacer 185.

Figure 12:
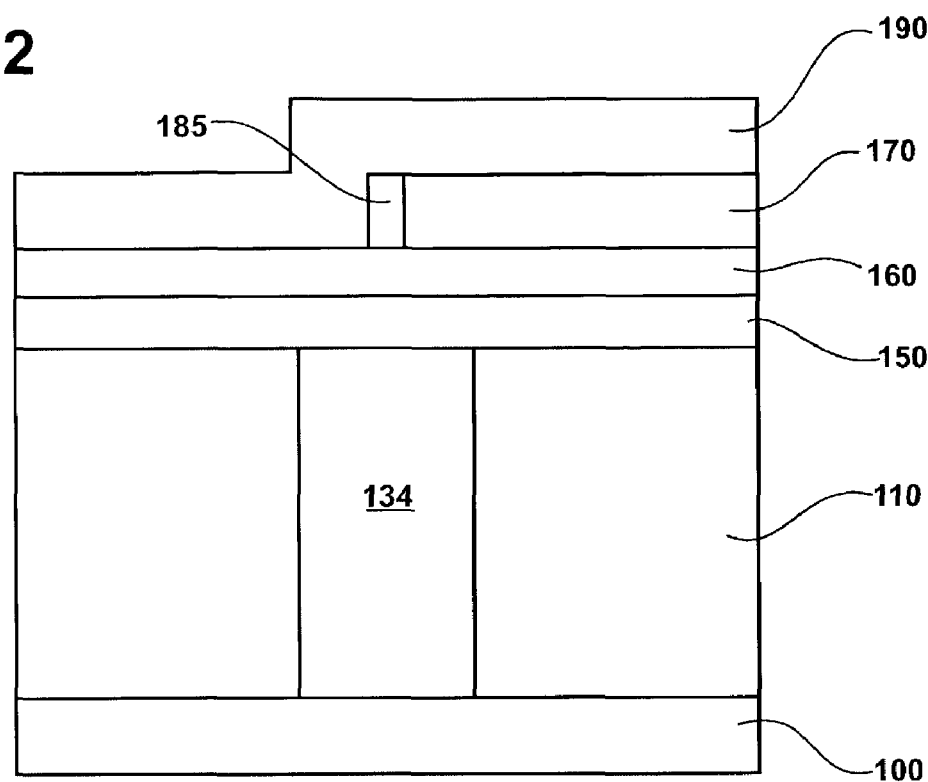

Referring to FIG. 12, a layer 190 is then deposited over the structure shown in FIG. 11 to form the structure shown in FIG. 12. The layer 190 is preferably formed of the same material as the layer 170 which, in the embodiment shown, is an oxide (such as silicon dioxide from a TEOS source). However, like layer 170, it is possible (in other embodiments of the invention) to form the layer 190 from another type of dielectric (such as a nitride), from a semi-conductor or from a conductor. The layer 190 is deposited over the top surface of layer 170, over the sidewall spacer 185 and over an exposed portion of the nitride layer 160. As shown in FIG. 12, oxide material 170 and oxide material 190 are present on opposite sides of the sidewall spacer 185.

Figure 13:
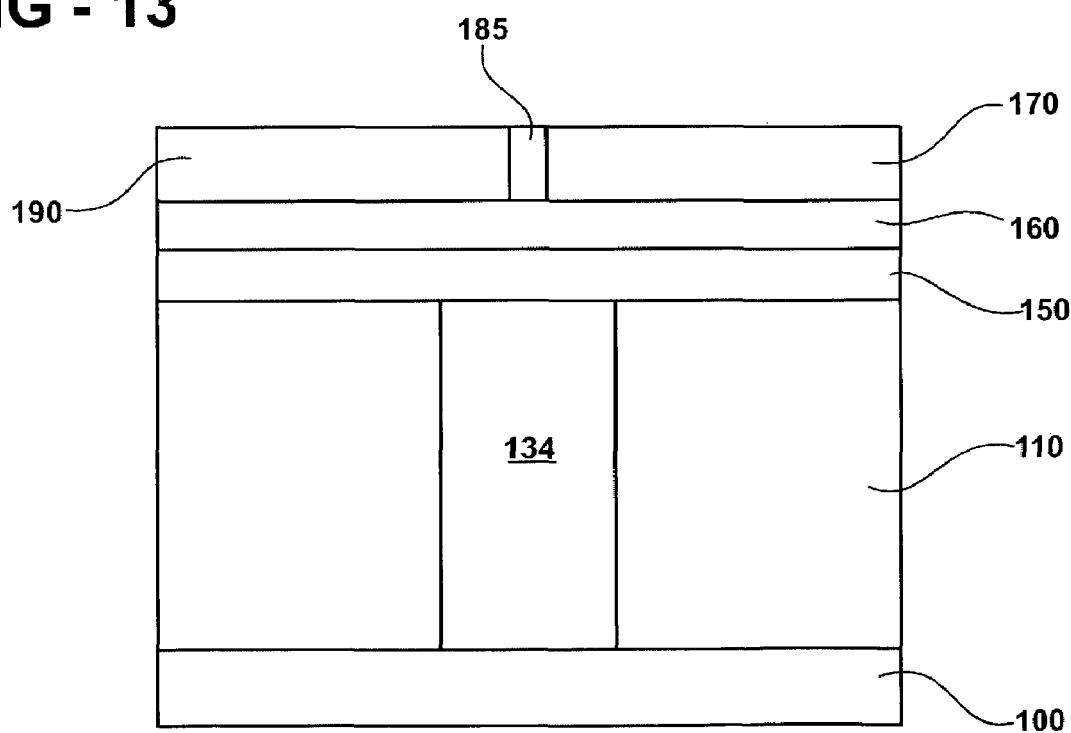
Figure 14:
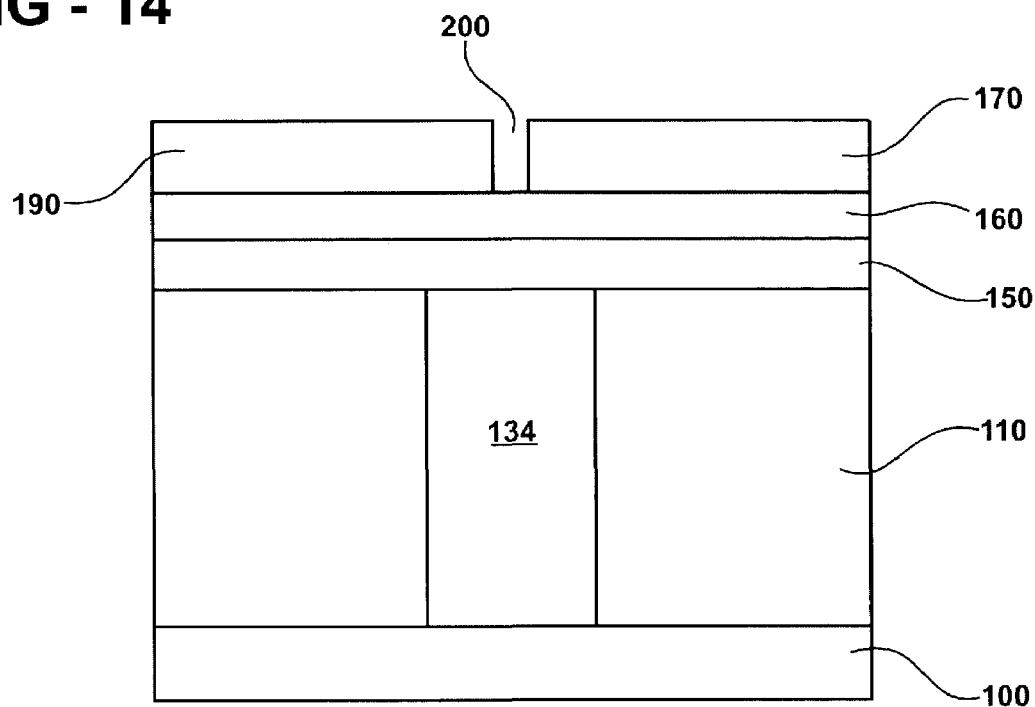

The structure shown in FIG. 12 is then chemically mechanically polished to remove a portion of the oxide layer 190 and to expose the top surface of the polysilicon spacer 185 and form the structure shown in FIG. 13. The structure shown in FIG. 13 may, optionally, be subjected to a partial etch of both of the top oxide layers 170, 190 (to reduce the thickness of these oxide layers). Referring to FIG. 14, the polysilicon spacer 185 is then removed by being etched selective to the TEOS oxide layers 170, 190. This forms the trench or slot-like opening 200 between the oxide layers 170 and 190. The opening 200 exposes a portion of the nitride layer 160.

Figure 15:
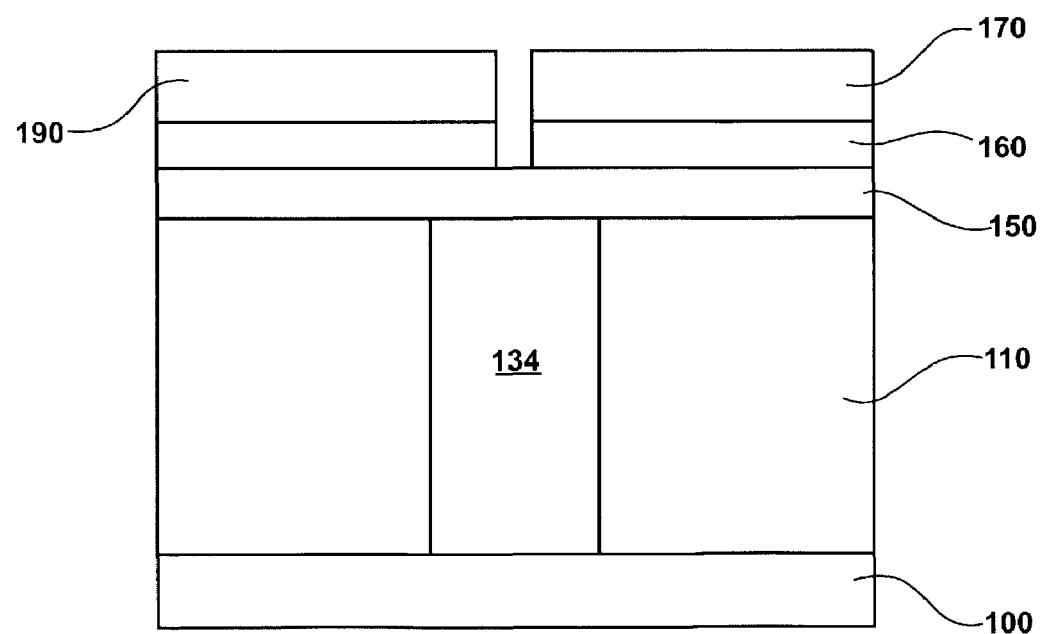

The nitride layer 160 is then etched selective to the oxide thereby extending the opening 200 through the nitride layer to expose the top surface of oxide layer 150 as shown in FIG. 15. The oxide layers 150, 170 and 190 are then etched selective to the nitride layer 160 to form the structure shown in FIG. 16. (Optionally, prior to this last oxide etch, the oxide layers 170, 190 may be chemically mechanically polished to reduce the thickness of these layers).

Figure 16:
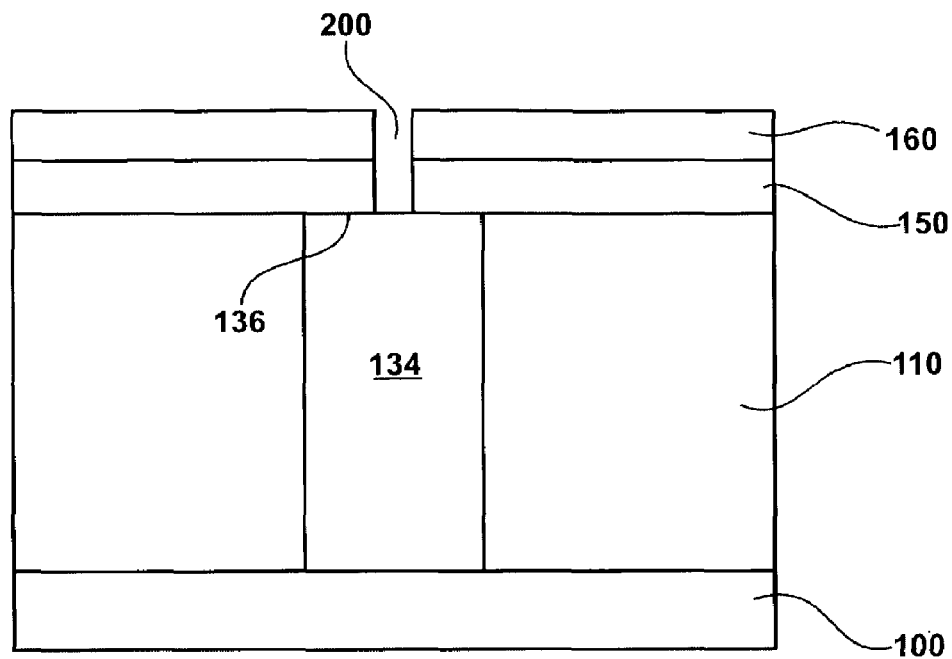
Figure 17:
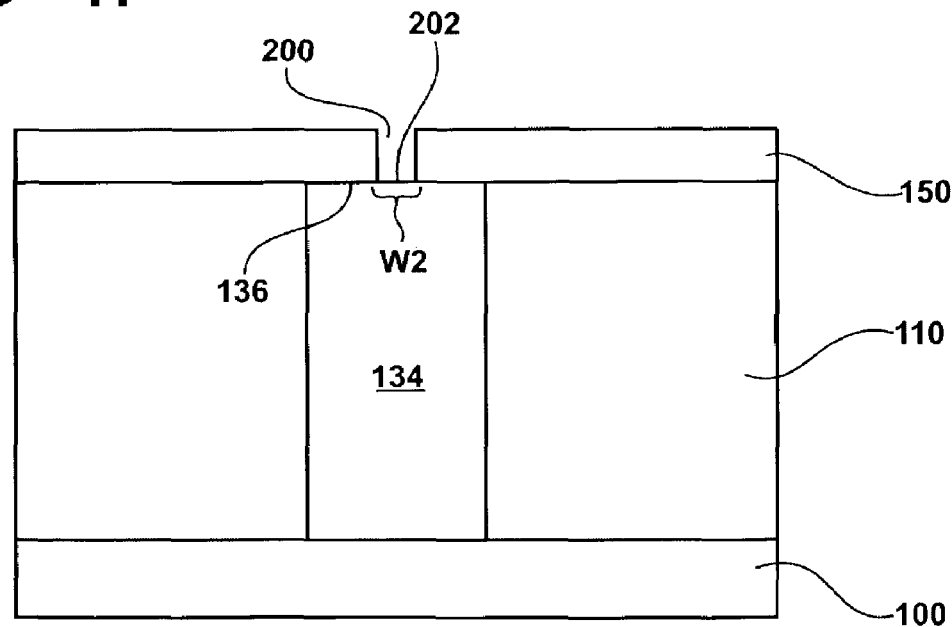

As shown in FIG. 16, the oxide etch removes the oxide layers 170, 190 and also extends the opening 200 through the oxide layer 150 so as to expose or uncover a portion of the top edge 136 of the bottom electrode 134. Referring to FIG. 17, the nitride layer 160 is then removed by being etched selective to the oxide layer 150. The nitride etch may be performed using a hot phosphoric acid. Referring to FIG. 17, it is noted that the opening 200 is in the form of a narrow trench or slot having a bottom surface 202. The opening 200 has a width "W2" (a lateral dimension of the opening). The width "W2" is defined by a lateral (i.e., parallel to the substrate) thickness of the spacer 185 shown in FIG. 13. The width "W2" may be less than the photolithographic limit. The width "W2" is preferably less than about 1000 Angstroms, more preferably less than about 500 Angstroms and, most preferably less than about 300 Angstroms.

Referring to FIG. 18, a layer 210 of programmable resistance material is deposited over the oxide layer 150 and into the opening 200. The programmable resistance material is thus adjacent to (and preferably makes contact with) the exposed portion of the top edge 136 of the bottom electrode 134. The programmable resistance material is in electrical communication with the bottom electrode 134. Substantially all electrical communication between the bottom electrode 134 and the programmable resistance material is preferably through the exposed portion of the top edge 136 of the bottom electrode 134. A layer 220 of conductive material is then deposited over the layer 210 of programmable resistance material. The conductive layer 220 forms the top electrode of the memory device. A three-dimensional view of the memory device is shown in FIG. 19.

Figure 21A:
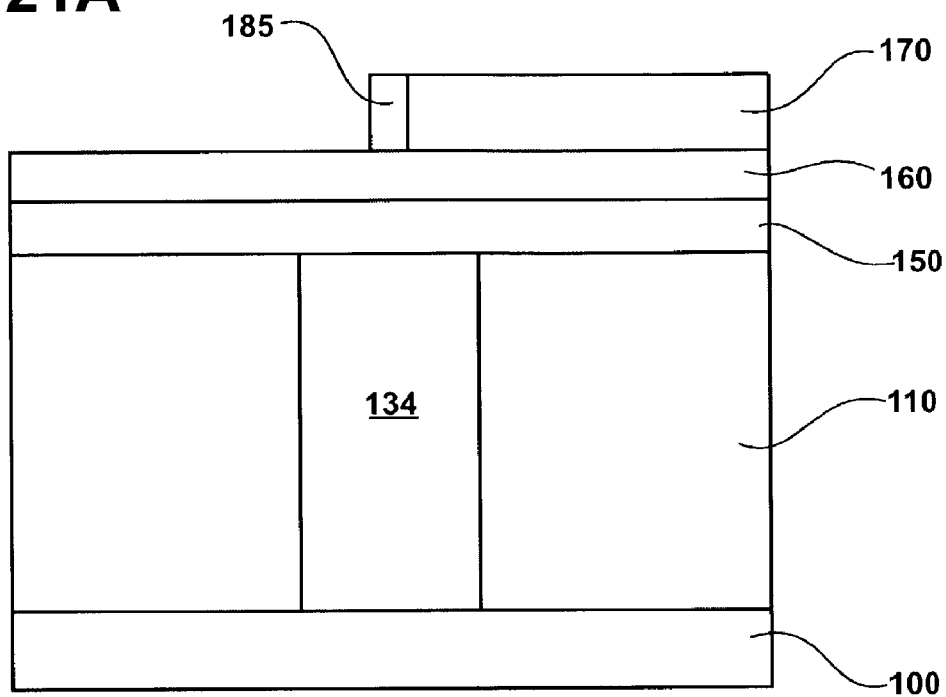
FIGS. 21A through 21D show alternate process steps for making an embodiment of a memory cell of the present invention.
Figure 21B:
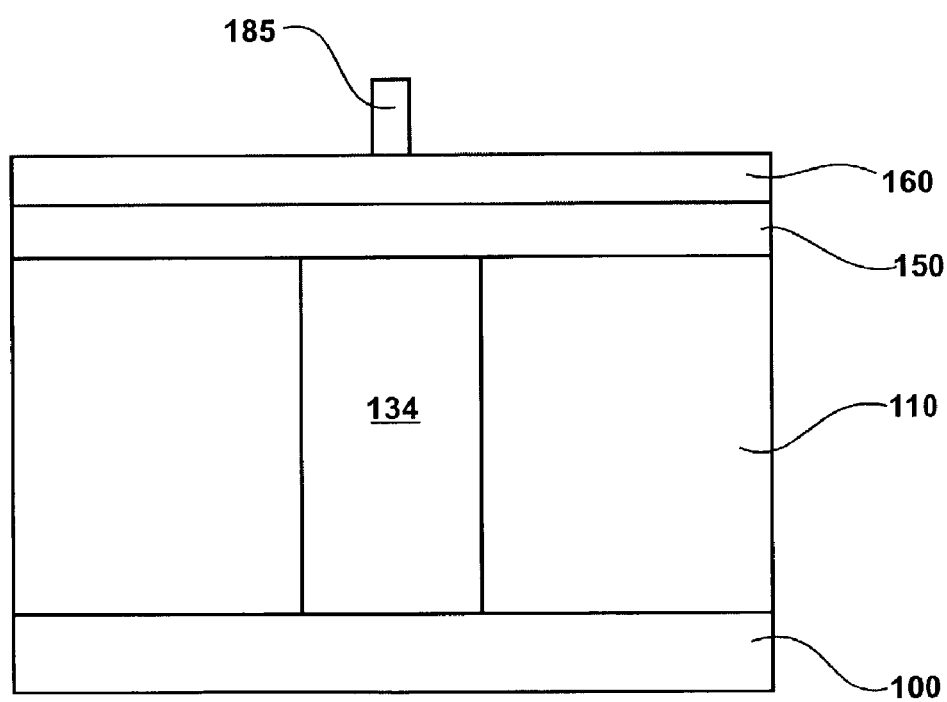
Figure 21C:
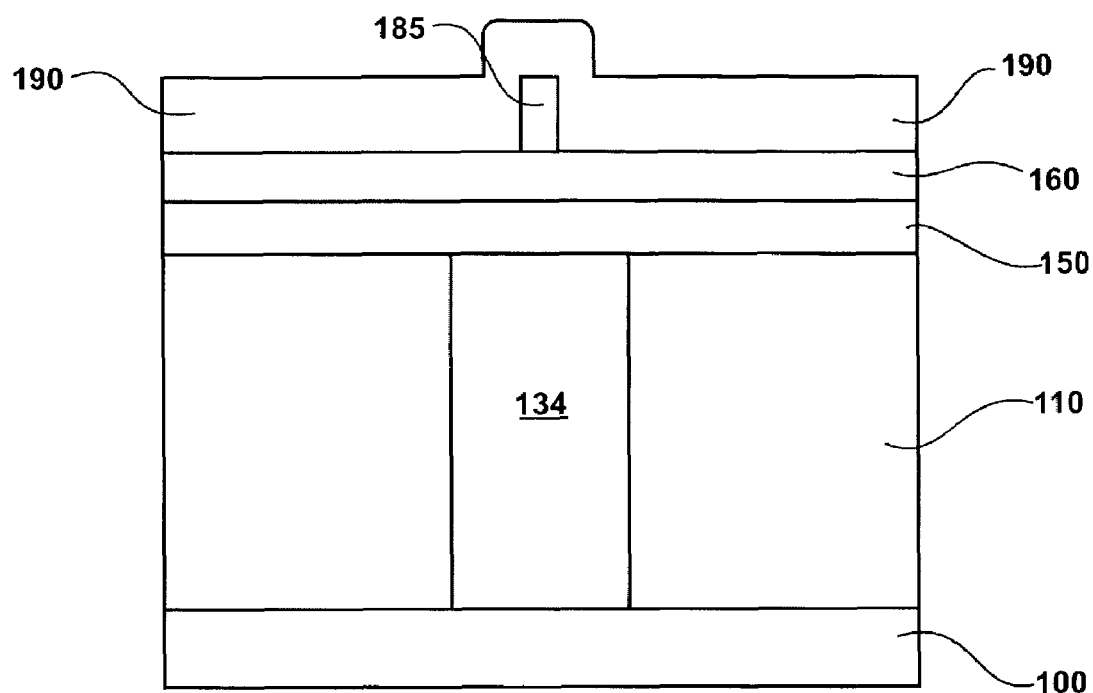
Figure 21D:
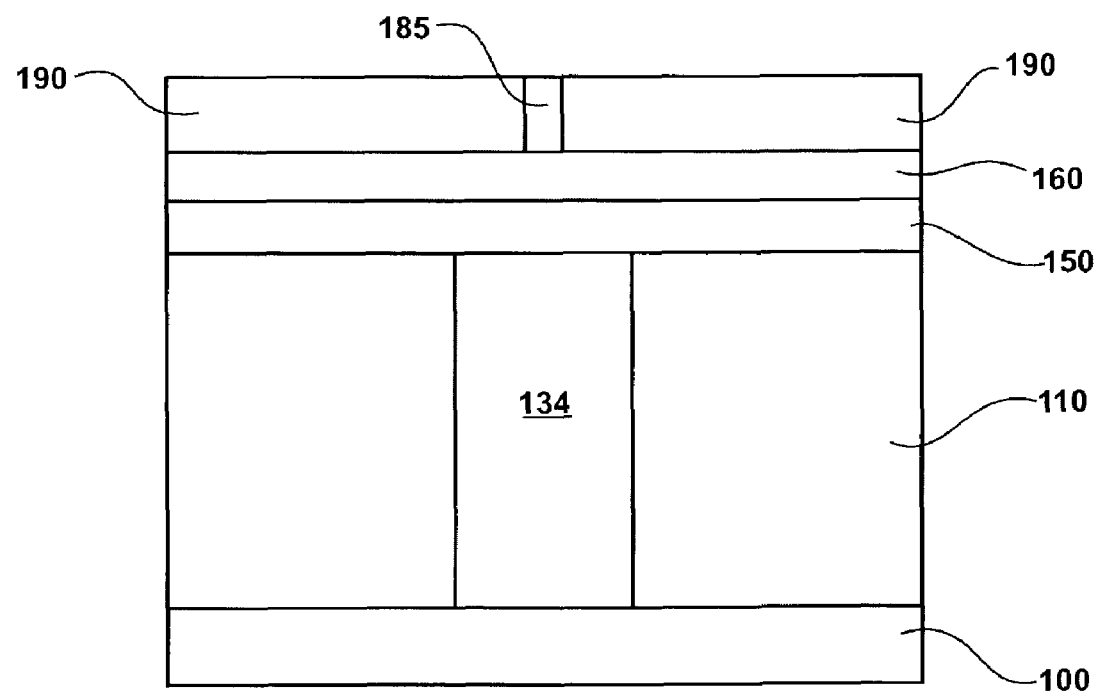

It is noted that the memory device shown in FIGS. 18 and 19 may be formed using alternate processing steps. An example of alternate process steps is shown in FIGS. 21A through 21D. FIG. 21A shows the cross-section of the memory device from FIG. 11. Referring to FIG. 21B, it is possible at this stage of the process to remove the oxide layer 170 to form the structure shown in FIG. 21B. That is, the oxide layer 170 is etched selective to the polysilicon spacer 185 and selective to the underlying nitride layer 160. An oxide layer 190 is then deposited over the exposed portion of nitride layer 160 and over the polysilicon sidewall spacer 185 to form the structure shown in FIG. 21C. The structure shown in FIG. 21C may then be chemically mechanically polished to remove a portion of the oxide layer 190 and to expose the top surface of the polysilicon spacer and form the structure shown in FIG. 21D. The structure shown in FIG. 21D is the same as the structure shown in FIG. 13 except that oxide material 190 (of FIG. 21D replaces oxide material 170 of FIG. 13). The oxide material 190 is present on opposite sides of the sidewall spacer 185 and the sidewall spacer 185 may be removed to form an opening in the oxide material 190. Hence, the processing steps shown in FIGS. 21A-D may be used to replace the processing steps shown in FIGS. 11-13. (The CMP step of FIG. 21D may be easier to do than the CMP step of FIG. 13).

Figure 22A:
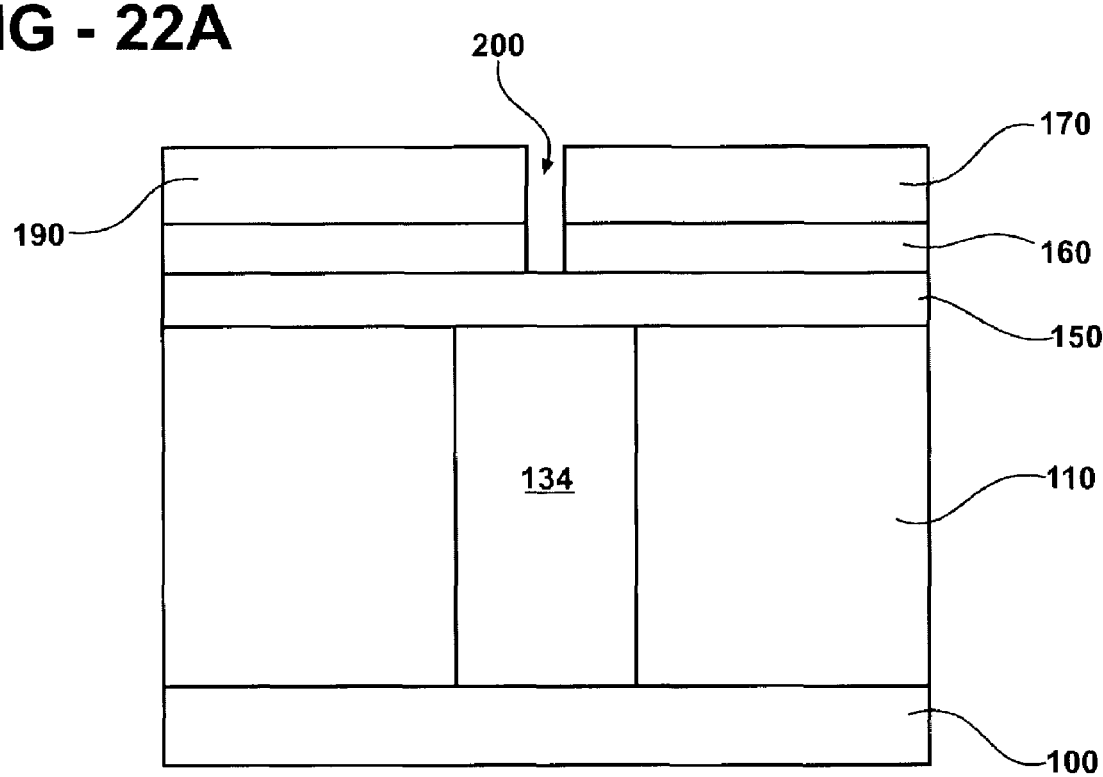
FIGS. 22A through 22D show alternate process steps for making an embodiment of a memory cell the present invention.
Figure 22B:
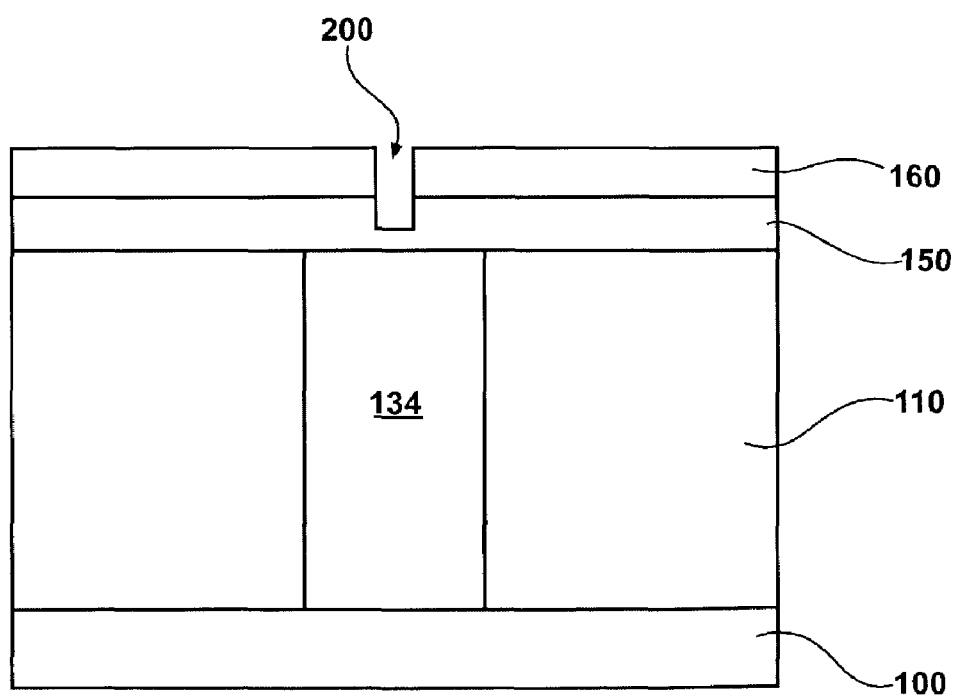
Figure 22C:
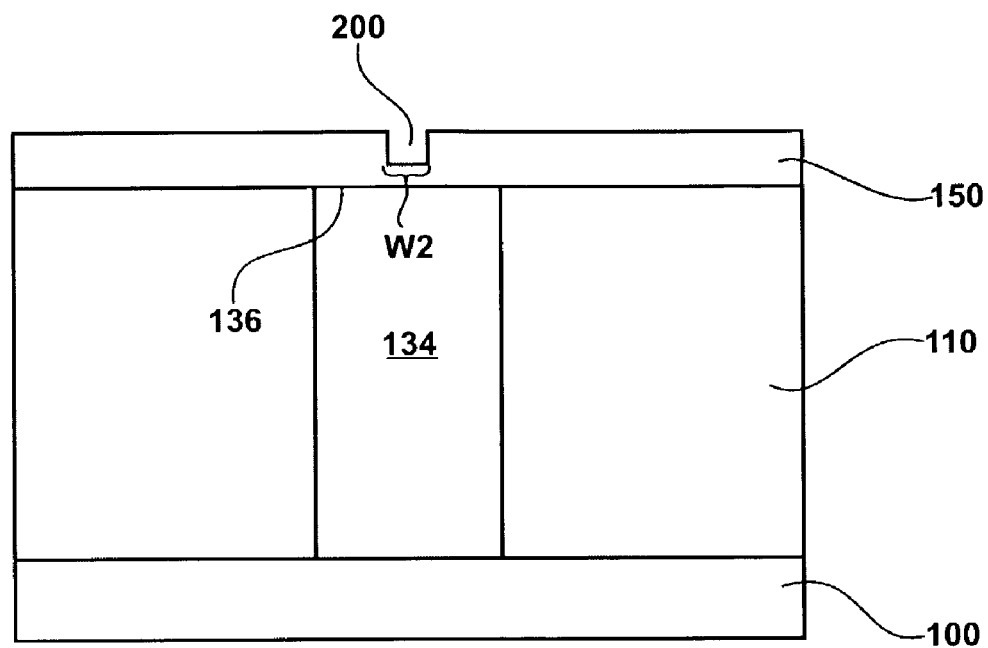
Figure 22D:
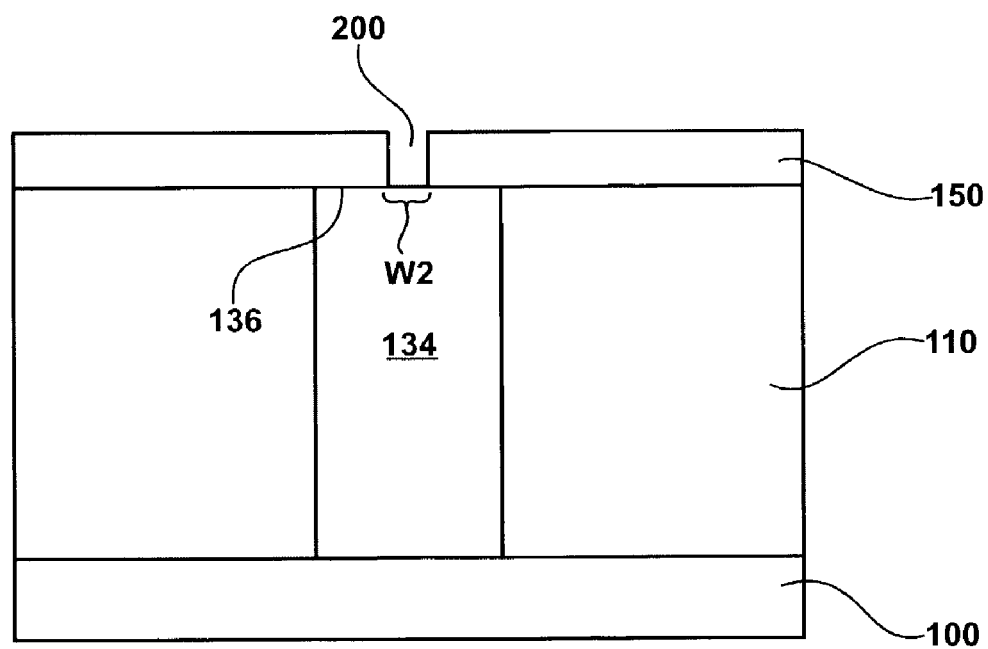

Another example of using alternate processing steps is shown in FIGS. 22A-22D. FIG. 22A shows a cross-sectional view of the memory device from FIG. 15. FIG. 22A shows the oxide layers 170, 190, nitride layer 160 and the trench-like opening 200 that extends through oxide layers 170, 190 as well as nitride layer 160. The opening 200 extends to the top surface of oxide layer 150. Referring to FIG. 22B, the oxide layers 170 and 190 are removed by being etched selective to the underlying nitride layer 160. Oxide layer 150 is also etched at the same time as the oxide layers 170, 190. Referring to FIG. 22B, it is seen that oxide layer 150 is etched to form a recess in the oxide layer 150 that does not go all the way through the oxide layer 150 (the recess may go through about two-thirds of the oxide layer 150). Hence, the opening 200 is extended only partially through the oxide layer 150. Referring to FIG. 22C the nitride layer 160 is then removed, preferably by being etched selective to the underlying oxide. Referring to FIG. 22D, the entire oxide layer 150 is then etched to remove the remaining portion of the oxide material within the opening 200 thereby extending the opening all the way to the top surface of the bottom electrode 200. This last oxide etch also decreases the thickness of the remaining portion of the oxide layer 150. It is noted that the structure shown in FIG. 22D is similar to that shown in FIG. 17. The processing steps shown in FIGS. 22A-D thus replaces the processing steps shown in FIGS. 15-17.

Referring again to FIG. 12, it is again noted that in one embodiment of the invention, layers 150, 170 and 190 are preferably oxides (such as a silicon dioxide); the spacer 185 is preferably formed of polysilicon; and layer 160 is preferably formed of a nitride (such as silicon nitride). However, it is again noted that other materials may be used for each of the layers. For example the layer 150 may be formed of any other dielectric (such as a nitride). Generally, the layers 160, 170, 185 and 190 may be formed from a dielectric (such as oxide or nitride), semi-conductor (such as polysilicon), or conductor (such as a metal). The material selected for each layer is preferably chosen to provide the proper selectivity during the etching process steps as will be recognized by persons of ordinary skill in the art.

In yet other embodiments of the invention, it is possible to form the memory device without the use of the layer 160 (shown in FIGS. 8-16, 21A-D, 22A-B). For example, referring to FIG. 12, the layers 170, 185 and 190 may be formed directly over layer 150 without the need to first deposit layer 160 over layer 150. The layer 160 may be removed from the sequence of processing steps by appropriately selecting the materials used for the remaining layers 150,-170, 185 and 190. As noted above, the material used for each layer is preferably chosen to provide the proper selectivity during the etching process steps. As an example, it is possible that in one embodiment of the invention, layer 150 is chosen to be an oxide, layers 170 and 190 chosen to be a nitride, and layer 185 chosen to be polysilicon. As another example, it is possible that in another embodiment, layer 150 be chosen to be a nitride, layers 170 and 190 chosen to be an oxide, and layer 185 chosen to be polysilicon.

Referring to FIGS. 18 and 19, it is noted that the memory structure of the present invention provides for a very small total area of contact between the bottom electrode 134 and the programmable resistance memory material 150. Preferably, substantially all electrical communication between the bottom electrode 134 and the memory material 150 is through that portion of the upper surface or edge 136 that is adjacent to (or actually makes contact with) the bottom surface 202 of the opening 200.

Figure 20A:
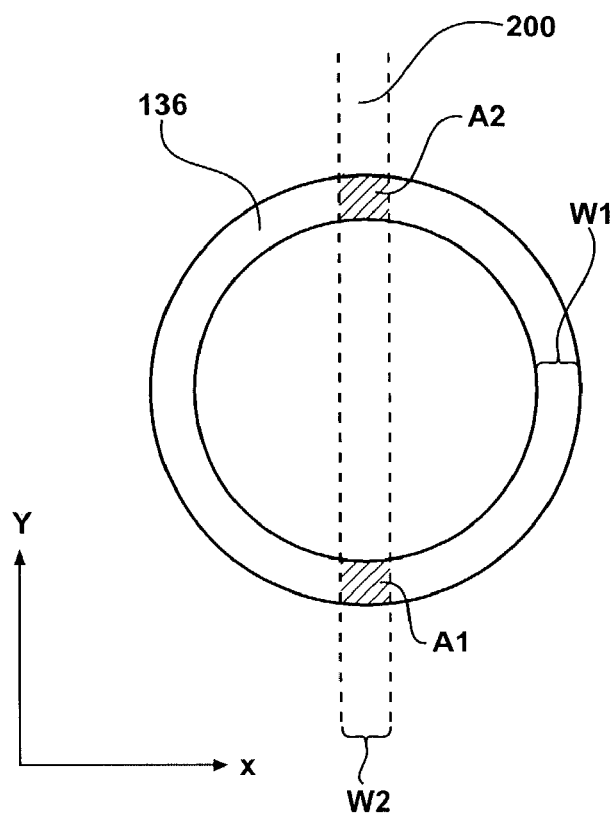
FIG. 20A shows a top view of an embodiment of a memory cell of the present invention.

The two areas of contact "A1" and "A2" between the memory material and the bottom electrode may be seen in the embodiment shown in FIG. 20A which shows a top view of the slot 200 in relation to the upper surface or edge 136 of the bottom electrode 134. As noted above, the thickness or width "W1" of the upper edge 136 is preferably less than the photolithographic limit. The thickness W1 is preferably less than about 1000 Angstroms, more preferably less than about 500 Angstroms and most preferably less than about 300 Angstroms. The width W2 of the slot or opening 200 is also preferably less than a photolithographic limit. The width W2 is preferably less than about 1000 Angstroms, more preferably less than about 500 Angstroms, and most preferably less than about 300 Angstroms.

Figure 20B:
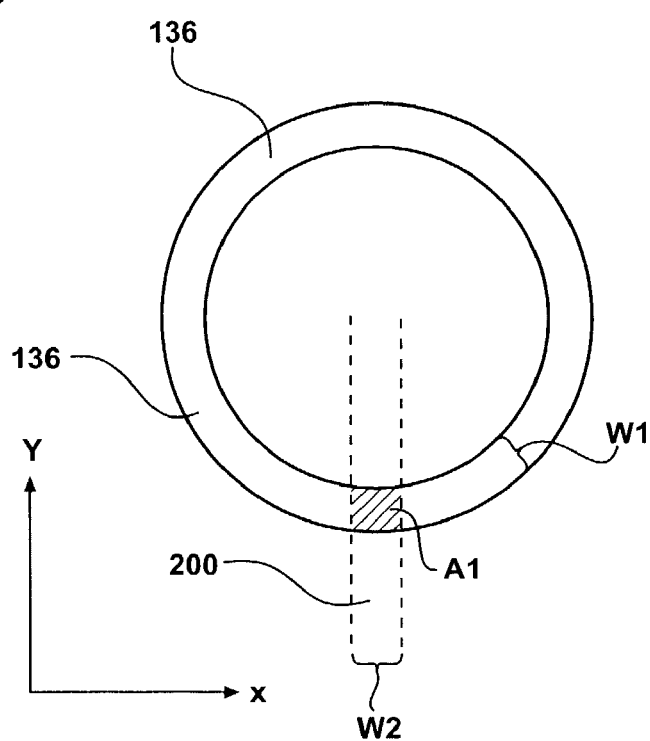
FIG. 20B shows a top view of an embodiment of a memory cell of the present invention having a single area of contact.
Figure 20C:
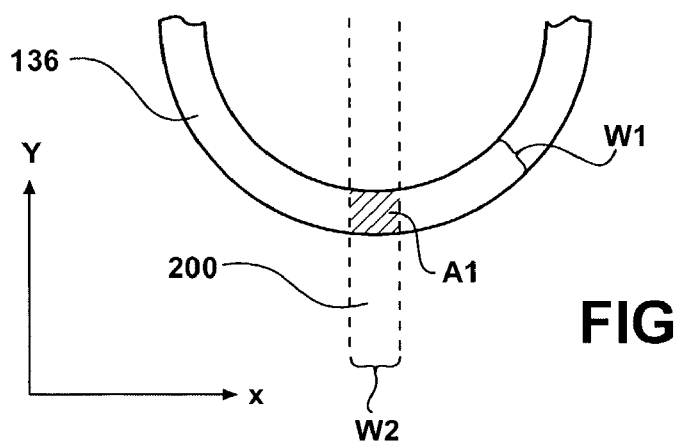
FIG. 20C shows a top view of an embodiment of a memory cell of the present invention having a single area of contact.

The opening or slot 200 may be positioned so that the memory material only intersects the top surface 136 of the bottom electrode at a single location (as shown in FIG. 20B). Alternately, the top surface 136 of the bottom electrode 134 may be appropriately etched so that the memory material only intersects the top surface 136 at a single location (as shown in FIG. 20C). That is, the total area of contact may be a single region of intersection defined by either A1 or A2. In the embodiments shown in FIGS. 20B and 20C the area of contact between the bottom electrode and the memory material is shown as A1. Hence, the area of contact between the bottom electrode and the memory material may preferably have a dimension less than about 1,000,000 square Angstroms, more preferably less than about 250,000 square Angstroms, and most preferably less than about 90,000 square Angstroms.

It is noted that in the embodiment of the invention shown in FIG. 19, the opening 200 is in the form of a narrow slot. However, in an alternate embodiment of the invention, the opening 200 may be in the form of a hole or pore. This will also result in a small area of contact between the bottom electrode and the programmable resistance material deposited into the hole. The hole of memory material may have a lateral dimension which is less than a photolithographic limit. In one embodiment, the pore or hole of memory material preferably has a lateral dimension which is less than about 1000 Angstroms, more preferably less than about 500 Angstroms and more preferably less than about 300 Angstroms. An example of a small hole or pore of memory material is found in U.S. patent application Ser. No. 09/955,408, the disclosure of which is incorporated by reference.

As noted above, the bottom electrode may be formed as a conductive sidewall spacer. An example of sidewall spacers is shown in FIG. 23E (side view) and FIG. 23F (three-dimensional view) and a method of forming the sidewall spacers is shown in FIGS. 23A to 23E. In the embodiment shown, the conductive sidewall spacers 134 are formed in a trench. However, a sidewall spacer may also be formed on other sidewall surfaces such as the sidewall surface of a hole or via.

Figure 23A:
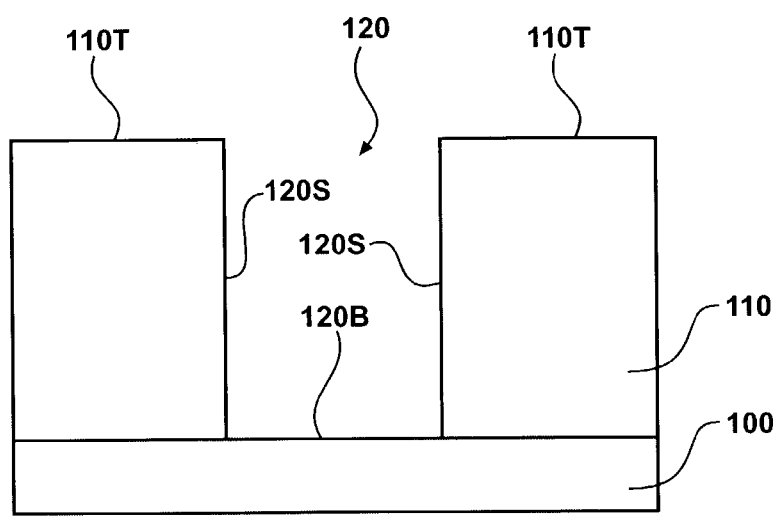
FIGS. 23A through 23E shows process steps for making conductive sidewall spacers.
Figure 23B:
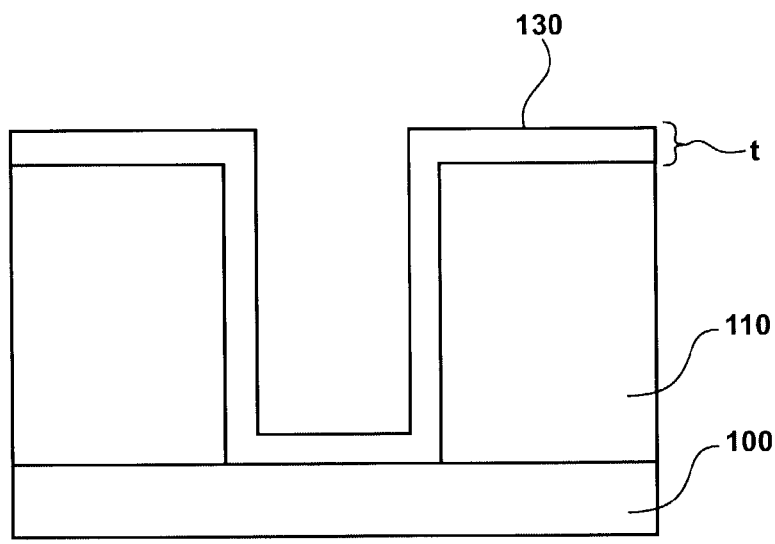
Figure 23C:
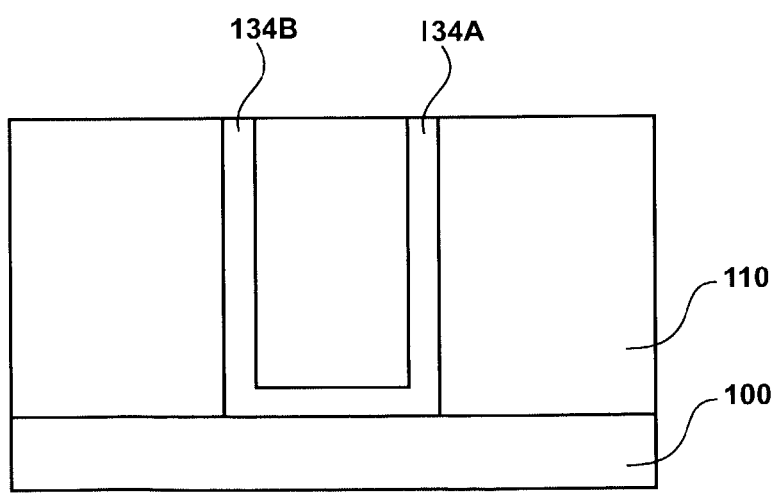

Referring to FIG. 23A, a dielectric material 110 is deposited onto a substrate 100. The dielectric material 110 has a top surface 110T. An opening 120 in the form of a trench is formed in the dielectric. The opening 120 includes the sidewall surfaces 120S and the bottom surface 120B. The sidewall surfaces 120S corresponds to sidewall surfaces of the dielectric. Referring to FIG. 23B, a conductive material 130 is then deposited on the top surface 110T as well as on the sidewall surfaces 120S and bottom surface 120B of the opening. The deposition of the conductive material 130 is preferably a substantially conformal deposition. The thickness "t" of the layer 130 is preferably less than the photolithographic limit. The thickness "t" of layer 130 is preferably, less than about 1000 Angstroms, more preferably less than about 500 Angstroms, and most preferably less than about 300 Angstroms. Referring to FIG. 23C, an anisotropic etch is then performed to remove the portions of the conductive material 130 that are parallel to the substrate (that is, those portions of the layer 130 that are horizontally disposed). The etch removes the portions of the conductive layer 130 that are on the top surface 110T of the dielectric as well as on the bottom surface 120B of the opening. The remaining portions of the conductive layer 130 are sidewall layers that form the sidewall spacers 134A,B.

Figure 23D:
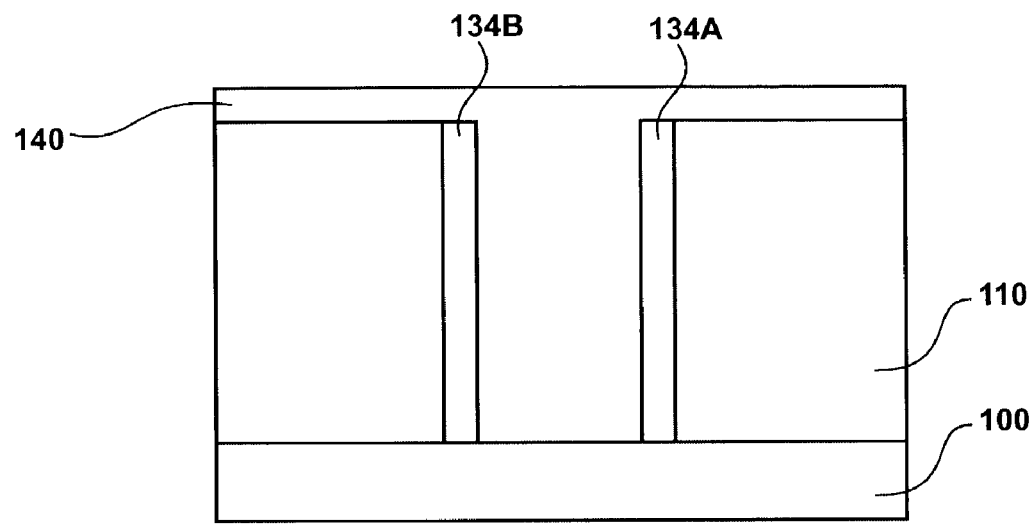
Figure 23E:
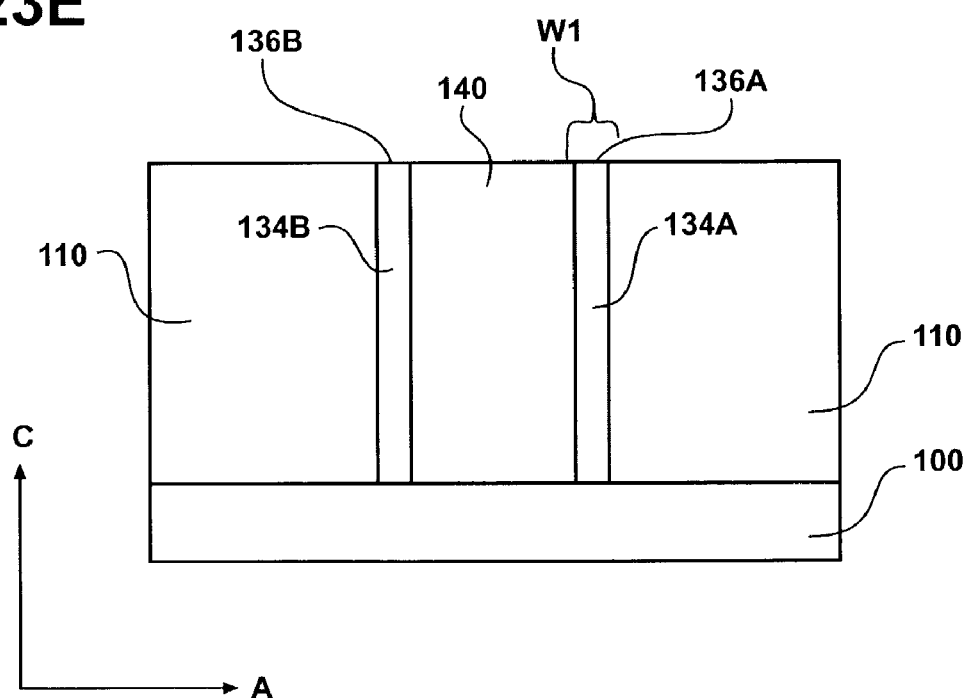

Referring to FIG. 23D, another layer of dielectric 140 is then deposited into the opening 120. Referring to FIG. 23E, the dielectric material 140 is then chemically mechanically polished to expose the top surfaces or edges 136A,B of each of the sidewall spacers 134A,B. The width W1 of the top surface or edge 136A,B of each sidewall spacer corresponds to the thickness of the spacer. Likewise, the thickness of the spacer corresponds to the thickness "t" of the deposition of conductive material 130 shown in FIG. 23B. The width W1 of top surface or edge may be less than the photolithographic limit (which, as discussed above, is currently greater than 1000 Angstroms). The width W1 is preferably less than about 1000 Angstroms, more preferably less than about 500 Angstroms, and most preferably less than about 300 Angstroms. Sidewall spacers 134A,B are shown in FIG. 23E (side view in the "ac" plane) while FIG. 23F is a three-dimensional view.

The processing steps shown in FIGS. 8, 9A, 9B, 10 through 18 may be used to form a narrow slot 200 of programmable resistance memory material having a bottom surface 202 above one or both of the sidewall spacers shown in FIGS. 23E and 23F. The side view of the memory device is shown in FIG. 23G. This view is through the sidewall spacer 134A and is in the "bc" plane, which is perpendicular to the plane of illustration shown in FIG. 23E. The slot 200 is formed in dielectric material 150 and extends perpendicular to the plane of the illustration. The slot 200 has bottom surface 202. The bottom surface 202 has a width W2. The width W2 may be less than the photolithographic limit. Preferably, the width W2 of the slot of memory material is less than about 1000 Angstroms, more preferably less than about 500 Angstroms, and most preferably less than about 300 Angstroms. Programmable resistance material 210 is formed in the slot and a top electrode 220 is formed on the memory material.

Figure 24:
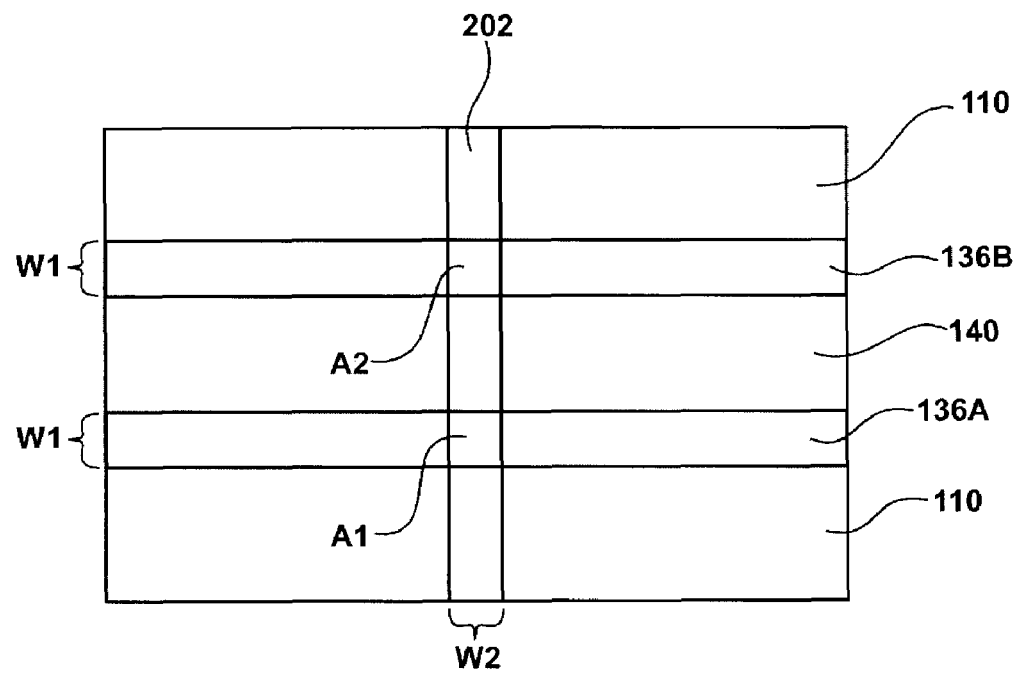
FIG. 24 shows a top view of an embodiment of a memory cell of the present invention that uses a sidewall spacer as the bottom electrode.

A top view of an embodiment of the memory element (perspective in the "ab" plane) is shown in FIG. 24. In the embodiment shown in FIG. 24, the bottom surface 202 of the slot of memory material is in electrical communication with the top surface or edge 136A,B of both conductive spacers with area of contacts shown as A1 and A2. However, preferable, only one of the conductive spacers serves as the bottom electrode for a single memory element. Hence, it is preferable that there be only a single area of contact (either A1 or A2) between a bottom electrode of the memory element and the memory material. It is possible that each of the sidewall spacers 134A and 134B shown in FIG. 23F corresponds to a bottom electrode of a different memory element. Alternately, the slot of memory material may be appropriately staggered (or "broken up" into segments) so that the bottom surface 202 of the slot 200 makes electrical contact with the top surface of only one of the sidewall spacers. It is also possible that the top surface of one of the sidewall spacers be appropriately etched so that the bottom surface 202 of the slot makes electrical contact with the top surface of only one of the sidewall spacers.

Figure 25:
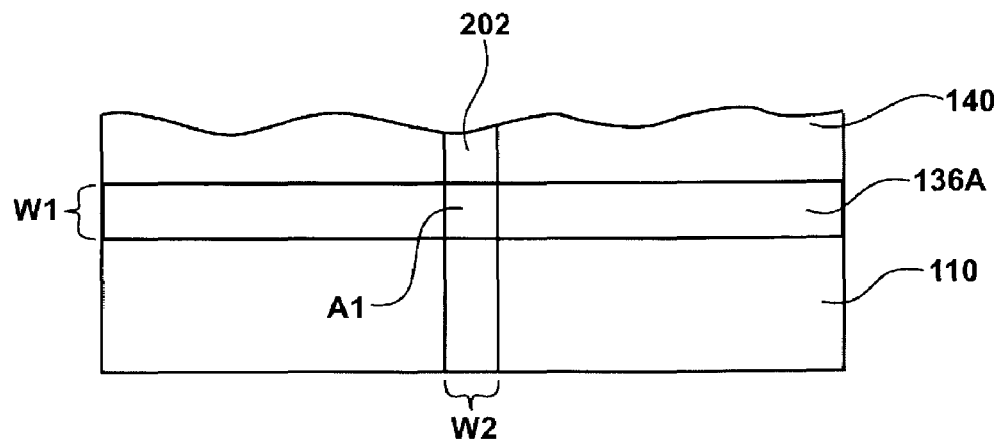
FIG. 25 shows a top view of an embodiment of a memory cell of the present invention that uses a sidewall spacer as the bottom electrode.

Hence, it is possible that either the memory material or sidewall spacers be formed and/or processed so that the bottom surface of the memory material contacts the top surface of only a single sidewall spacer. This is shown in FIG. 25, where the area of contact "A1" between the bottom surface 202 of a slot of memory material and the top surface 136A of a bottom electrode in the form of a single sidewall spacer has dimensions that correspond to the width W1 of the top surface or edge 136A of a sidewall spacer and the width W2 of the bottom surface 202 of the slot of memory material. Hence, the total area of contact between the bottom electrode and the memory material is preferably less than W1 multiplied by W2. The total area of contact is preferably less than about 1,000,000 square Angstroms, more preferably, more preferably less than about 250,000 square Angstroms, and most preferably less than about 90,000 square Angstroms.

In the embodiment shown in FIG. 25, the top surface or edge 136A of the conductive spacer is shown as substantially perpendicular to the bottom surface 202 of the slot. However, it is possible that the top surface 136A and the bottom surface 202 simply run traverse (non-parallel) to each other.

It is noted, that in the embodiment shown in FIG. 23F, a pair of conductive sidewall spacers 134A,B are formed in a trench. In this embodiment, each sidewall spacer has a linear top surface or edge 136A,B. It is also possible to form a sidewall in a hole. If the hole is round, then the sidewall spacer formed in the hole will have a top surface in the form of an annulus.

In addition, in an alternate embodiment of the present invention is also possible to form a layer of programmable resistance memory material and position the layer of memory material so that only an edge of the memory material is adjacent to the edge of an electrode. Hence, substantially all electrical communication between the electrode and the memory material would be through the portion of the edge of the electrode and the portion of the edge of the memory material that are adjacent (or in actual contact). For example, referring to FIG. 7B, it is possible that a layer of memory material may be positioned relative to the top edge 136 of the bottom electrode 134 so that only an edge of the layer of memory material is adjacent to the top surface or edge 136 of the bottom electrode 134. This "edge-to-edge" type of structure also provides for a small area of contact between the memory material and electrode. Preferably, the edge of the programmable resistance material is positioned transverse to the edge of the electrode.

Figure 26:
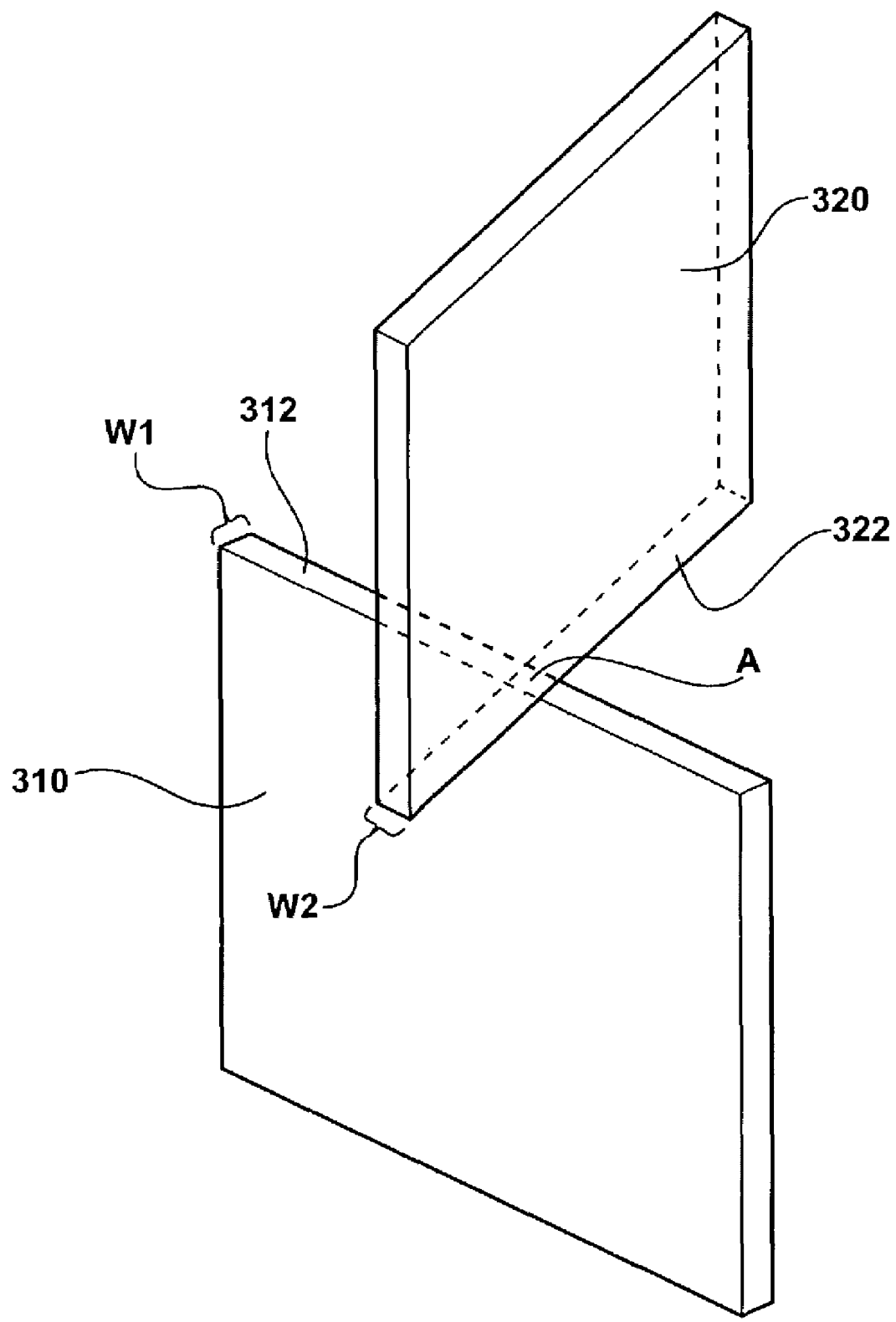
FIG. 26 shows an embodiment of an edge-to-edge arrangement of a memory material in contact with a conductive material.

An example of an edge-to-edge type of structure between an electrode and a memory material is illustrated by the embodiment of the invention shown in FIG. 26. FIG. 26 shows a bottom electrode 310 having a top surface or edge 312. In the embodiment shown, the electrode 310 is in the form of a layer of conductive material. The top surface or edge 312 of the bottom electrode 310 has a width W1. The width W1 may be less than the photolithographic limit. The width W1 is preferably less than about 1000 Angstroms, more preferably less than about 500 Angstroms, and most preferably less than about 300 Angstroms.

FIG. 26 also shows a layer 230 of programmable resistance memory material having a bottom surface or edge 322. The bottom surface or edge 322 of the memory material has a width W2. The width W2 may be less than the photolithographic limit. Width W2 is preferably less than about 1000 Angstroms, more preferably less than about 500 Angstroms, and most preferably less than about 300 Angstroms. (The width W1 as well as the width W2 may each be non-lithographically defined dimensions).

Substantially all electrical communication between the memory material and the electrode occurs through at least a portion of the top surface 312 of the electrode and at least a portion of the bottom surface 322 of the memory material. In particular, the area of contact between the bottom electrode 310 and the memory material 320 is the area of contact "A". Substantially all electrical communication between the electrode and memory material occurs through the area of contact A. The area of contact A has an area which is preferably less than W1 multiplied by W2. The area of contact is preferably less than about 1,000,000 square Angstroms, more preferably less than about 250,000 square Angstroms, and most preferably less than about 90,000 square Angstroms.

It is noted that other edge-to-edge type configurations are possible. The electrode and the memory material may have any shape or orientation. Likewise, the electrode and material may have any positioning relative to each other. For example, the electrode may be above, below or to the side of the memory material.

It is further noted that one or more additional layers may be disposed between the bottom electrode and the programmable resistance material. For example, a barrier layer may, optionally, be formed between the top edge of the bottom electrode and the programmable resistance material. Barrier layer materials may be chosen to increase the conductivity between the bottom electrode and the memory material, and/or improve the adhesion between the bottom electrode and the memory material, and/or to prevent the electromigration of the electrical contact material into the memory material. Examples of certain barrier layer materials include, but are not limited to, titanium silicide, cobalt silicide and tungsten silicide.

The memory elements of the present invention may be electrically coupled to isolation/selection devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Hence, associated with each memory element of a memory array structure is isolation/addressing device which serves as an isolation/addressing device for that memory element thereby enabling that cell to be read and written without interfering with information stored in other adjacent or remote memory elements of the array.

The programmable resistance material may be programmed to at least first resistance state and a second resistance state. The programmable resistance material is preferably programmed by electrical signals (such as currents). In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The programmable resistance materials may be directly overwritable so that they can be programmed from any of their resistance states to any other of their resistance states without first having to be set to a starting state. Preferably, the same programming pulse or pulses may be used to program the memory material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

I claim:

1. A programmable resistance memory element, comprising:
   a cup-shaped conductive layer having an open end facing upward; and
   a layer of programmable resistance material having a bottom surface with a width less than 500 Angstroms, said bottom surface of said layer of programmable resistance material being in electrical contact with a contact surface of said cup-shaped conductive layer, thereby defining an electrical contact area less than 250,000 square Angstroms between said bottom surface and said contain surface, the contact surface of said cup-shaped conductive layer being an edge of said conductive layer that is substantially coplanar with said bottom surface of said programmable resistance material.

2. The programmable resistance memory element of claim 1, wherein said contact surface of said cup-shaped conductive layer has a width less than 500 Angstroms.

3. The programmable resistance memory element of claim 1, wherein said programmable resistance material comprises a phase-change material.

4. The programmable resistance memory element of claim 1, wherein said programmable resistance material comprises a chalcogen element.

5. The programmable resistance memory element of claim 1, wherein said layer of programmable resistance material is formed in a trench or a pore, said trench or pore disposed above the cup-shaped conductive layer.

6. The programmable resistance memory element of claim 1, wherein said cup-shaped conductive layer is substantially cylindrical cup-shaped.

7. A programmable resistance memory element, comprising:
   a first dieleciric material having an opening and top surface, said opening having a sidewall surface, said top surface, and a bottom surface;
   a conductive layer formed over said sidewall surface and having a substantially continuous edge coplanar with the top surface of the first dielectric material;
   a second dieleciric layer formed over said conductive layer within said opening; and
   a layer of programmable resistance material having a bottom surface with a width less than 300 Angstroms, said bottom surface of said layer of programmable resistance material in electrical contact with a contact surface of said conductive layer.

8. The programmable resistance memory element of claim 7, wherein said conductive layer is formed over said bottom surface of said opening.

9. The programmable resistance memory element of claim 7, wherein said conductive layer is a conductive liner.

10. The programmable resistance memory element of claim 7, wherein said conductive layer is a conductive spacer.

11. The programmable resistance memory element of claim 7, wherein said conductive layer is cup-shaped.

12. The programmable resistance memory element of claim 11, wherein said cup-shaped conductive layer is substantially cylindrically cup-shaped.

13. The programmable resistance memory element of claim 7, wherein said conductive layer is U-shaped.

14. The programmable resistance memory element of claim 7, wherein said programmable resistance material comprises a phase-change material.

15. The programmable resistance memory element of claim 7, wherein said programmable resistance material comprises at least one chalcogen element.

16. The programmable resistance memory element of claim 7, wherein said layer of programmable resistance material is formed in a trench or pore, said trench or pore disposed above the conductive layer.

17. The programmable resistance memory element of claim 7, wherein said contact surface of said conductive layer has a width less than 500 Angstroms.

18. A memory element, comprising:
a cup-shaped conductive layer having a first surface, said first surface having a first width less than 500 Angstroms extending in a first direction; and
a layer of programmable resistance material having a bottom surface with a width of less than 500 angstroms, said bottom surface of said layer of programmable resistance material forming a contact surface that overlaps said first surface of said cup-shaped conductive layer defining an electrical contact area between said contact surface and said first surface, said contact surface having a second width less than 500 Angstroms extending in a second direction different from said first direction and said electrical contact area being less than 250,000 square Angstroms, the first surface of said cup-shaped conductive layer being an edge of said conductive layer that is substantially coplanar with said contact surface of said programmable resistance material.

19. The memory element of claim 18, wherein said second width of said contact surface is less than 300 Angstroms.

20. The memory element of claim 18, wherein said layer of programmable resistance material is formed in a french or pore, said trench or pore disposed above a cup-shaped conductive layer.

21. The memory element of claim 18, wherein said cup-shaped conductive layer is substantially cylindrically cup-shaped.

22. The memory element of claim 18, wherein said programmable resistance material comprises a phase-change material.

23. The memory element of claim 18, wherein said programmable resistance material comprises a chalcogenide material.

24. A memory element, comprising:
a first dielectric material having an opening and a top surface, said opening having a sidewall surface, said top surface, and a bottom surface;
a conductive layer formed over said sidewall surface and having a substantially continuous edge coplanar with the top surface of the first dielectric material, said conductive layer having a first surface defined by said edge having a first width less than 500 Angstroms extending in a first direction;
a second dielectric layer formed over said conductive layer within said opening; and
a layer of programmable resistance material having a bottom surface with a width of less than 300 angstroms, said bottom surface of said layer of programmable resistance material forming a contact surface that overlaps said first surface of said conductive layer defining an electrical contact area between said contact surface and said first surface, said contact surface having a second dimension less than 300 Angstroms extending in a second direction different from said first direction and said electrical contact area is less than 250,000 square Angstroms.

25. The memory element of claim 24, wherein said conductive layer is formed over said bottom surface of said opening.

26. The memory element of claim 24, wherein said conductive layer is a conductive liner.

27. The memory element of claim 24, wherein said conductive layer is a conductive spacer.

28. The memory element of claim 24, wherein said conductive layer is cup-shaped.

29. The memory element of claim 28, wherein said cup-shaped conductive layer is substantially cylindrically cup-shaped.

30. The memory element of claim 24, wherein said conductive layer is U-shaped.

31. The memory element of claim 24, wherein said programmable resistance material is formed in a trench or a pore, said trench or pore disposed above said conductive layer.

32. The memory element of claim 24, wherein said first width of said first surface is less than 300 Angstroms.

33. The memory element of claim 24, wherein said programmable resistance material comprises a phase-change material.

34. The memory element of claim 24, wherein said programmable resistance material comprises a chalcogenide material.

* * * * *